(12) United States Patent
Yokoyama et al.

(10) Patent No.: US 9,093,404 B2
(45) Date of Patent: Jul. 28, 2015

(54) LIGHT-EMITTING DEVICE AND METHOD FOR MANUFACTURING THE SAME

(71) Applicants: Semiconductor Energy Laboratory Co., Ltd., Kanagawa-ken (JP); Sharp Kabushiki Kaisha, Osaka (JP)

(72) Inventors: Kohei Yokoyama, Kanagawa (JP); Tomohiro Kosaka, Osaka (JP); Fumikazu Shimoshikiryoh, Osaka (JP); Shinichi Kawato, Osaka (JP); Katsuhiro Kikuchi, Osaka (JP); Manabu Niboshi, Osaka (JP); Takashi Ochi, Osaka (JP); Yuto Tsukamoto, Osaka (JP); Tomofumi Osaki, Osaka (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 0 days.

(21) Appl. No.: 14/132,852

(22) Filed: Dec. 18, 2013

(65) Prior Publication Data

US 2014/0175470 A1 Jun. 26, 2014

(30) Foreign Application Priority Data

Dec. 21, 2012 (JP) ................... 2012-280107

(51) Int. Cl.
| | |
|---|---|
| *H01L 51/56* | (2006.01) |
| *H01L 33/62* | (2010.01) |
| *H01L 51/50* | (2006.01) |
| *H01J 1/62* | (2006.01) |
| *H01L 27/32* | (2006.01) |

(52) U.S. Cl.
CPC ........ *H01L 27/3246* (2013.01); *H01L 51/5056* (2013.01); *H01L 51/5072* (2013.01); *H01L 27/3211* (2013.01); *H01L 2251/558* (2013.01)

(58) Field of Classification Search
CPC .......................... H01L 29/24; H01L 2924/00
USPC ........ 313/498, 405, 505, 512; 257/99, 88, 40, 257/E33.01; 438/16, 22, 29, 34
See application file for complete search history.

(56) References Cited

U.S. PATENT DOCUMENTS

| | | |
|---|---|---|
| 5,119,156 A | 6/1992 | Kawahara et al. |
| 6,107,734 A | 8/2000 | Tanaka et al. |

(Continued)

FOREIGN PATENT DOCUMENTS

| | | |
|---|---|---|
| JP | 11-329748 | 11/1999 |
| JP | 11-339958 A | 12/1999 |

(Continued)

*Primary Examiner* — Mark A. Laurenzi, III
*Assistant Examiner* — Brian Turner
(74) *Attorney, Agent, or Firm* — Husch Blackwell LLP

(57) ABSTRACT

The light-emitting device includes a first lower electrode, a second lower electrode, a partition, a layer with high conductivity, light-emitting layers, and an upper electrode. The conductivity of the layer with high conductivity is higher than the conductivity of each of the light-emitting layers and lower than the conductivity of each of the lower electrodes and the upper electrode. The partition includes a first slope located on a first lower electrode side and a second slope located on a second lower electrode side. The thickness of the layer with high conductivity located over the first slope in a direction perpendicular to the first slope is different from the thickness of the layer with high conductivity located over the second slope in a direction perpendicular to the second slope.

13 Claims, 10 Drawing Sheets

(56) References Cited

U.S. PATENT DOCUMENTS

| | | | |
|---|---|---|---|
| 6,373,453 B1 | 4/2002 | Yudasaka | |
| 6,392,722 B1 | 5/2002 | Sekime et al. | |
| 6,420,834 B2 | 7/2002 | Yamazaki et al. | |
| 6,469,439 B2 | 10/2002 | Himeshima et al. | |
| 6,555,968 B2 | 4/2003 | Yamazaki et al. | |
| 6,559,594 B2 | 5/2003 | Fukunaga et al. | |
| 6,597,121 B2 | 7/2003 | Imura | |
| 6,614,174 B1 | 9/2003 | Urabe et al. | |
| 6,618,029 B1 | 9/2003 | Ozawa | |
| 6,720,198 B2 | 4/2004 | Yamagata et al. | |
| 6,750,618 B2 | 6/2004 | Yamazaki et al. | |
| 6,768,257 B1 | 7/2004 | Yamada et al. | |
| 6,798,132 B2 | 9/2004 | Satake | |
| 6,815,723 B2 | 11/2004 | Yamazaki et al. | |
| 6,828,726 B2 | 12/2004 | Sakurai et al. | |
| 6,969,291 B2 | 11/2005 | Urabe et al. | |
| 6,991,506 B2 | 1/2006 | Yamada et al. | |
| 6,992,439 B2 | 1/2006 | Yamazaki et al. | |
| 7,015,503 B2 | 3/2006 | Seki et al. | |
| 7,057,209 B2 | 6/2006 | Yamazaki et al. | |
| 7,098,602 B2 | 8/2006 | Yamazaki et al. | |
| 7,173,281 B2 | 2/2007 | Hirakata et al. | |
| 7,214,959 B2 | 5/2007 | Seki et al. | |
| 7,221,338 B2 | 5/2007 | Yamazaki et al. | |
| 7,265,391 B2 | 9/2007 | Yamazaki et al. | |
| 7,273,801 B2 | 9/2007 | Seki et al. | |
| 7,384,860 B2 | 6/2008 | Nakamura et al. | |
| 7,402,948 B2 | 7/2008 | Yamazaki et al. | |
| 7,420,203 B2 | 9/2008 | Tsutsui et al. | |
| 7,420,210 B2 | 9/2008 | Yamazaki et al. | |
| 7,423,293 B2 | 9/2008 | Yamagata et al. | |
| 7,442,955 B2 | 10/2008 | Seki et al. | |
| 7,473,923 B2 | 1/2009 | Tsutsui et al. | |
| 7,585,761 B2 | 9/2009 | Yamazaki et al. | |
| 7,623,098 B2 | 11/2009 | Yamazaki et al. | |
| 7,623,099 B2 | 11/2009 | Yamazaki et al. | |
| 7,623,100 B2 | 11/2009 | Yamazaki et al. | |
| 7,662,011 B2 | 2/2010 | Yamazaki et al. | |
| 7,683,535 B2 | 3/2010 | Fukunaga et al. | |
| 7,692,186 B2 | 4/2010 | Yamazaki et al. | |
| 7,697,106 B2 | 4/2010 | Sawasaki et al. | |
| 7,719,014 B2 | 5/2010 | Yamazaki et al. | |
| 7,745,993 B2 | 6/2010 | Fukunaga et al. | |
| 7,753,751 B2 | 7/2010 | Yamazaki | |
| 7,792,489 B2 | 9/2010 | Hirakata et al. | |
| 7,902,746 B2 | 3/2011 | Park | |
| 7,932,518 B2 | 4/2011 | Seki et al. | |
| 7,956,349 B2 | 6/2011 | Tsutsui et al. | |
| 7,956,353 B2 | 6/2011 | Tsutsui et al. | |
| 7,977,876 B2 | 7/2011 | Yamazaki et al. | |
| 7,982,206 B2 | 7/2011 | Yamazaki et al. | |
| 7,990,348 B2 | 8/2011 | Yamazaki et al. | |
| 8,026,531 B2 | 9/2011 | Seo et al. | |
| 8,089,066 B2 | 1/2012 | Yamazaki et al. | |
| 8,119,468 B2 | 2/2012 | Miyairi et al. | |
| 8,138,032 B2 | 3/2012 | Miyairi et al. | |
| 8,193,699 B2 | 6/2012 | Fujioka et al. | |
| 8,194,008 B2 | 6/2012 | Yamazaki et al. | |
| 8,237,355 B2 | 8/2012 | Yamazaki | |
| 8,432,097 B2 | 4/2013 | Hirakata et al. | |
| 8,441,185 B2 | 5/2013 | Kuwabara et al. | |
| 2001/0004469 A1 | 6/2001 | Himeshima et al. | |
| 2002/0047514 A1 | 4/2002 | Sakurai et al. | |
| 2002/0093286 A1 | 7/2002 | Ohshita et al. | |
| 2003/0127967 A1 | 7/2003 | Tsutsui et al. | |
| 2003/0146439 A1 | 8/2003 | Yamazaki et al. | |
| 2003/0189400 A1 | 10/2003 | Nishio et al. | |
| 2004/0061118 A1 | 4/2004 | Yamazaki et al. | |
| 2005/0156197 A1 | 7/2005 | Tsutsui et al. | |
| 2006/0081844 A1 | 4/2006 | Hirosue et al. | |
| 2006/0091797 A1 | 5/2006 | Tsutsui et al. | |
| 2006/0214152 A1 | 9/2006 | Seo et al. | |
| 2007/0015430 A1 | 1/2007 | Nishio et al. | |
| 2007/0045621 A1 | 3/2007 | Suzuki et al. | |
| 2007/0194321 A1 | 8/2007 | Yamazaki et al. | |
| 2009/0009069 A1 | 1/2009 | Takata | |
| 2009/0020751 A1 | 1/2009 | Seki et al. | |
| 2009/0045738 A1 | 2/2009 | Tsutsui et al. | |
| 2010/0171138 A1 | 7/2010 | Yamazaki et al. | |
| 2011/0227119 A1 | 9/2011 | Tsutsui et al. | |
| 2011/0227125 A1 | 9/2011 | Tsutsui et al. | |
| 2011/0266548 A1 | 11/2011 | Yamazaki et al. | |
| 2011/0273080 A1 | 11/2011 | Kimura et al. | |
| 2012/0007110 A1 | 1/2012 | Seo et al. | |
| 2012/0018770 A1* | 1/2012 | Lu et al. | 257/99 |
| 2012/0205678 A1* | 8/2012 | Ikeda et al. | 257/88 |
| 2012/0217516 A1 | 8/2012 | Hatano et al. | |
| 2012/0273804 A1 | 11/2012 | Hatano | |
| 2012/0305922 A1 | 12/2012 | Yamazaki | |
| 2013/0001620 A1 | 1/2013 | Sugisawa et al. | |
| 2014/0103368 A1 | 4/2014 | Hatano et al. | |
| 2014/0103385 A1 | 4/2014 | Hatano et al. | |
| 2014/0175469 A1 | 6/2014 | Dozen et al. | |

FOREIGN PATENT DOCUMENTS

| | | |
|---|---|---|
| JP | 2001-148291 A | 5/2001 |
| JP | 2001-195008 A | 7/2001 |
| JP | 2003-059671 A | 2/2003 |
| JP | 2003-123969 A | 4/2003 |
| JP | 2003-243171 A | 8/2003 |
| JP | 2003-257650 A | 9/2003 |
| JP | 2005-235491 A | 9/2005 |
| JP | 2006-302870 | 11/2006 |
| JP | 2007-141821 A | 6/2007 |
| JP | 2008-234885 | 10/2008 |
| JP | 2009-277590 | 11/2009 |
| JP | 2010-027591 A | 2/2010 |

* cited by examiner

Rrg > Roled

Rrg >> Roled

LIGHT-EMITTING DEVICE AND METHOD FOR MANUFACTURING THE SAME

BACKGROUND OF THE INVENTION

1. Field of the Invention

The present invention relates to a light-emitting device including a single element or a tandem element and a method for manufacturing the light-emitting device.

2. Description of the Related Art

Commercialization of organic electroluminescence (EL) displays is accelerating. Displays are increasingly required to provide high luminance for outdoor use. It is known that the luminance of an organic EL element increases in proportion to electric current and light emission at high luminance can be achieved.

However, a large current flow accelerates deterioration of organic EL elements. Thus, if high luminance can be achieved with a small amount of current, light-emitting elements can have longer lifetime. In this regard, a tandem element in which a plurality of EL layers is stacked has been proposed as a light-emitting element capable of providing high luminance with a small amount of current (see Patent Document 1, for example).

Note that organic EL elements include single elements in which an EL layer including a light-emitting layer is provided between two electrodes (a cathode and an anode), and tandem elements in which two or more EL layers are stacked between two electrodes and an intermediate layer is provided between the EL layers. When n EL layers are stacked in a tandem element, n-fold luminance can be obtained without an increase in current density.

In this specification and the like, a light-emitting layer refers to a layer containing a light-emitting organic compound. A light-emitting layer may be separated into island shapes corresponding to respective elements or may be common to a plurality of elements. An electrode includes a lower electrode, an upper electrode, an anode, and a cathode. An EL layer includes at least a light-emitting layer, and can be further combined with any of a hole-injection layer, a hole-transport layer, an electron-transport layer, an electron-injection layer, a charge generation layer, and the like as appropriate. An intermediate layer includes an electron-injection buffer layer, an electron-relay layer, and a charge generation layer.

Further, a layer with high conductivity described later refers to a layer which has higher conductivity than a light-emitting layer and lower conductivity than an electrode. The layer with high conductivity includes an electron-injection layer, an electron-transport layer, a hole-injection layer, a hole-transport layer, and an intermediate layer. Examples of a material of the layer with high conductivity include a mixed material of an organic compound and a metal oxide, a conductive high molecule material, and the like. In this manner, the EL layer includes a layer with high conductivity and a layer with low conductivity typified by a light-emitting layer.

Note that the electron-injection buffer layer included in the intermediate layer may have an extremely small thickness. A material of the electron-injection buffer layer may be included in part of the EL layer in contact with the electron-injection buffer layer.

A display which includes a single element or a tandem element in which carrier-injection layers with high conductivity (an electron-injection layer and a hole-injection layer), carrier-transport layers (an electron-transport layer and a hole-transport layer), and an intermediate layer are formed has a problem of a crosstalk phenomenon. The crosstalk phenomenon refers to a phenomenon in which current leaks to an adjacent EL element in an adjacent pixel through a layer with high conductivity of the EL element. The crosstalk phenomenon is serious when the width of a partition between EL elements, which is described later, is reduced for the purpose of increasing definition of a display.

In particular, in a tandem element, a plurality of EL layers are stacked with an intermediate layer provided therebetween, and a mixed layer of an organic compound and a metal oxide, a carrier-injection layer with high conductivity including a conductive high molecule, or the like is often used in order to reduce driving voltage; therefore, the tandem element includes layers with high conductivity and layers with low conductivity because of its structure. Furthermore, in the tandem element, electrical resistance between an anode and a cathode is higher than in a single element; thus, current is easily transmitted to an adjacent pixel through the highly conductive layer.

Note that a tandem element is not only the one having a problem of a crosstalk phenomenon. Even in a single element, when a layer with high conductivity such as a carrier-injection layer or a carrier-transport layer is provided in the EL element, current might leak to an adjacent pixel, so that a crosstalk phenomenon might occur.

At least the following patterns can be considered as causes of the crosstalk phenomenon, depending on an element structure and a region where leakage occurs.

1. Leakage through a carrier-injection layer and/or a carrier-transport layer in a single element.
2. Leakage through an intermediate layer in a tandem element.
3. Leakage through a carrier-injection layer and/or a carrier-transport layer in a tandem element.

The current leakage through a carrier-injection layer and/or a carrier-transport layer is caused owing to leakage on part which is closer to a lower electrode than a light-emitting layer is, regardless of whether the carrier-injection layer and/or the carrier-transport layer are/is a hole-injection layer, a hole-transport layer, an electron-injection layer, and/or an electron-transport layer.

<1. Leakage Through Carrier-injection Layer and/or Carrier-transport Layer in Single Element>

FIG. 8 is a schematic diagram for showing a situation where a crosstalk phenomenon occurs in single elements owing to current leakage through a carrier-injection layer and/or a carrier-transport layer with high conductivity, so that adjacent pixels emit light. FIG. 8 illustrates a cross section of a light-emitting panel in which a red single element which emits red (R) light, a green single element which emits green (G) light, and a blue single element which emits blue (B) light are provided in the form of three stripes and shows the state where only the green single element is driven. Note that a crosstalk phenomenon can occur not only in the stripe arrangement but also in a mosaic arrangement, a delta arrangement, and the like.

The light-emitting panel includes the red single element, the green single element, and the blue single element which are adjacent with each other. The red single element is provided between an upper electrode 81 and a first lower electrode 82. The green single element is provided between the upper electrode 81 and a second lower electrode 83. The blue single element is provided between the upper electrode 81 and a third lower electrode 84.

A hole-injection-transport layer 90, a light-emitting layer 91, and an electron-transport-injection layer 92 are stacked in this order in each of the red, green, and blue single elements.

In the case where the upper electrode 81 has a light-transmitting property, a counter glass substrate 88 can be provided over the upper electrode 81, and a reflective electrode can be used as the lower electrode. The counter glass substrate 88 may include a red color filter, a green color filter, and a blue color filter although not illustrated. The red color filter, the green color filter, and the blue color filter overlap with the first lower electrode 82, the second lower electrode 83, and the third lower electrode 84, respectively.

When only the green single element is driven in the above-described light-emitting panel by application of a voltage between the second lower electrode 83 and the upper electrode 81, current might leak to the adjacent red or blue single element through the hole-injection-transport layer 90 with high conductivity, causing red line (the red single element) or blue line (the blue single element) to emit light and a crosstalk phenomenon to occur. Note that electrons flow as shown by arrows 93 and holes flow as shown by arrows 94.

<2. Leakage Through Intermediate Layer in Tandem Element>

FIG. 9 is a schematic diagram for showing a situation where a crosstalk phenomenon occurs in tandem elements owing to current leakage through an intermediate layer 86 having high conductivity, so that adjacent pixels emit light. FIG. 9 illustrates a cross section of a light-emitting panel (white panel) including tandem elements arranged in the form of three stripes and configured to emit white light, showing the state where only a second tandem element is driven.

The light-emitting panel includes first to third tandem elements which are adjacent to each other. The first tandem element is provided between the upper electrode 81 and the first lower electrode 82. The second tandem element is provided between the upper electrode 81 and the second lower electrode 83. The third tandem element is provided between the upper electrode 81 and the third lower electrode 84.

In each of the first to third tandem elements, a first EL layer 85, the intermediate layer 86, and a second EL layer 87 are stacked in this order. For example, when the first EL layer 85 includes a light-emitting layer capable of emitting blue light and the second EL layer 87 includes a light-emitting layer capable of emitting green light and a light-emitting layer capable of emitting red light, each tandem element can provide white light emission.

In the case where the upper electrode 81 has a light-transmitting property, the counter glass substrate 88 can be provided over the upper electrode 81, and a reflective electrode can be used as the lower electrode. The counter glass substrate 88 is provided with a blue color filter, a red color filter, and a green color filter which are not illustrated. The red color filter, the blue color filter, and the green color filter overlap with the first lower electrode 82, the second lower electrode 83, and the third lower electrode 84, respectively.

When only the blue line (the second tandem element) is driven in the above-described light-emitting panel by application of a voltage between the second lower electrode 83 and the upper electrode 81, current might leak to the adjacent first or third tandem element through the intermediate layer 86 with high conductivity, causing the red line (the first tandem element) or green line (the third tandem element) to emit light and a crosstalk phenomenon to occur.

<3. Leakage Through Carrier-injection Layer and/or Carrier-transport Layer in Tandem Element>

FIG. 10 is a schematic view for showing a situation where a crosstalk phenomenon occurs in tandem elements owing to current leakage through a carrier-injection layer and/or a carrier-transport layer (a hole-injection and/or a hole-transport layer) 89 with high conductivity, so that adjacent pixels emit light, illustrating a state where only the blue line (the second tandem element) is driven in the light-emitting panel (a white panel).

In each of first to third tandem elements, a first EL layer 85 including the carrier-injection layer and/or the carrier-transport layer 89, the intermediate layer 86, and the second EL layer 87 are stacked in this order.

Note that in the tandem elements, current leakage to adjacent pixels through each of the intermediate layer 86 and the carrier injection layer and/or carrier-transport layer 89 with high conductivity, and another layer with high conductivity might occur concurrently.

A conventional technique for preventing generation of a crosstalk phenomenon is described below.

<Conventional Technique 1 (See Patent Document 2>

FIG. 11 is a cross-sectional view schematically illustrating a light-emitting device of a conventional technique 1. First to third lower electrodes 82 to 84 are formed over a substrate 70, and partitions 72 are provided between the first to third lower electrodes 82 to 84. An EL layer 71 including a layer with high conductivity and a light-emitting layer is formed over the partitions 72 and the first to third lower electrodes 82 to 84 by an evaporation method. An upper electrode 81 is formed over the EL layer 71.

According to the conventional technique 1, the thickness of the EL layer 71 formed over a slope 74 by an evaporation method is reduced by increasing an inclination angle of the slope 74 of the partition 72, whereby the thickness of the layer with high conductivity included in the EL layer 71 is reduced. That is, the thickness of the layer with high conductivity included in the EL layer 71 formed over the slope 74 is set to smaller than the thickness of the layer with high conductivity included in the EL layer 71 formed over the first to third lower electrodes 82 to 84. Thus, the resistance of the layer with high conductivity included in the EL layer 71 formed over the slope 74 of the partition 72 can be larger than the resistance of the layer with high conductivity included in the EL layer 71 formed over the first to third lower electrodes 82 to 84. As a result, current can be prevented from leaking to an adjacent light-emitting element through the layer with high conductivity formed over the partition 72, so that generation of a crosstalk phenomenon can be prevented.

Note that when the inclination angle of the slope 74 of the partition 72 is increased, the upper electrode 81 formed over the slope 74 is also thinned, so that disconnection might occur or the resistance of the film might be increased; as a result, defective lighting might occur.

<Conventional Technique 2 (see Patent Document 3)>

FIG. 12 is a cross-sectional view schematically illustrating a light-emitting device of a conventional technique 2. First to third lower electrodes 82 to 84 are formed over a substrate 70, and partitions 72 are provided between the first to third lower electrodes 82 to 84. An EL layer 71 in which a layer with high conductivity and a light-emitting layer are stacked is formed over the first to third lower electrodes 82 to 84. The EL layer 71 is not formed over the partitions 72. An upper electrode 81 is formed over the partitions 72 and the EL layer 71.

According to the conventional technique 2, since the EL layer 71 is not formed over the partitions 72, a situation where current leaks to an adjacent light-emitting element through a layer with high conductivity which is formed over the partition 72 does not arise; as a result, generation of a crosstalk phenomenon can be prevented.

Note that in order not to form the EL layer 71 over the partitions 72, the EL layer 71 needs to be formed selectively over the first to third lower electrodes 82 to 84 by an evaporation method, an ink-jet method, or the like using a mask.

Therefore, an evaporation method has a disadvantage that manufacturing cost is high at the time of manufacturing a high definition panel because an expensive high definition mask is needed. Further, an ink-jet method has a disadvantage that control of an impact position is difficult, whereby an yield is reduced.

REFERENCE

Patent Documents

[Patent Document 1] Japanese Published Patent Application No. 2008-234885
[Patent Document 2] Japanese Published Patent Application No. 2009-277590
[Patent Document 3] Japanese Published Patent Application No. 2006-302870

SUMMARY OF THE INVENTION

An object of one embodiment of the present invention is to prevent a crosstalk phenomenon from occurring in a light-emitting device including a tandem element or a single element.

One embodiment of the present invention is a light-emitting device including a first lower electrode and a second lower electrode; a partition between the first lower electrode and the second lower electrode; an upper electrode over the first lower electrode, the partition, and the second lower electrode; and a layer with high conductivity and a light-emitting layer between the upper electrode and the first lower electrode, the partition, and the second lower electrode. In the embodiment of the present invention, the conductivity of the layer with high conductivity is higher than conductivity of the light-emitting layer and is lower than the conductivity of each of the first lower electrode, the second lower electrode, and the upper electrode; the partition includes a first slope located on the first lower electrode side and a second slope located on the second lower electrode side; and of a total thickness of the layer with high conductivity and the light-emitting layer between the upper electrode and the first lower electrode, the partition, and the second lower electrode, a total thickness in a direction perpendicular to the first slope is different from a total thickness in a direction perpendicular to the second slope.

In the above embodiment of the present invention, a smaller total thickness of the total thicknesses over the slopes is preferably smaller than a total thickness in a direction perpendicular to the first lower electrode and the second lower electrode, and a larger total thickness of the total thicknesses over the slopes is preferably larger than the total thickness in the direction perpendicular to the first lower electrode and the second lower electrode.

One embodiment of the present invention is a light-emitting device including a first light-emitting element including a first lower electrode, a layer with high conductivity, a light-emitting layer, and an upper electrode; and a second light-emitting element including a second lower electrode, the layer with high conductivity, a light-emitting layer, and the upper electrode. In the embodiment of the present invention, a partition is provided between the first lower electrode and the second lower electrode; the layer with high conductivity is provided over each of the first lower electrode, the partition, and the second lower electrode; the light-emitting layer of the first light-emitting element is located above the first lower electrode and provided over the layer with high conductivity; the light-emitting layer of the second light-emitting element is located above the second lower electrode and provided over the layer with high conductivity; the upper electrode is provided over the light-emitting layer of the first light-emitting element, the layer with high conductivity, and the light-emitting layer of the second light-emitting element; the conductivity of the layer with high conductivity is higher than the conductivity of each of the light-emitting layer of the first light-emitting element and the light-emitting layer of the second light-emitting layer, and is lower than the conductivity of each of the first lower electrode, the second lower electrode, and the upper electrode; the partition includes a first slope located on a first lower electrode side and a second slope on a second lower electrode side; and the thickness of the layer with high conductivity located over the first slope in a direction perpendicular to the first slope is different from the thickness of the layer with high conductivity located over the second slope in a direction perpendicular to the second slope.

One embodiment of the present invention is a light-emitting device including a first lower electrode and a second lower electrode; a partition between the first lower electrode and the second lower electrode; a first light-emitting layer over each of the first lower electrode, the partition, and the second lower electrode; a layer with high conductivity over the first light-emitting layer; a second light-emitting layer over the layer with high conductivity; and an upper electrode over the second light-emitting layer. In the embodiment of the present invention, the conductivity of the layer with high conductivity is higher than the conductivity of each of the first light-emitting layer and the second light-emitting layer and is lower than the conductivity of each of the first lower electrode, the second lower electrode, and the upper electrode; the partition includes a first slope located on a first lower electrode side and a second slope located on a second lower electrode; and the thickness of the layer with high conductivity located over the first slope in a direction perpendicular to the first slope is different from the thickness of the layer with high conductivity located over the second slope in a direction perpendicular to the second slope.

One embodiment of the present invention is a light-emitting device including a first lower electrode and a second lower electrode; a partition between the first lower electrode and the second lower electrode; a first layer with high conductivity over each of the first lower electrode, the partition, and the second lower electrode; a first light-emitting layer over the first layer with high conductivity; a second layer with high conductivity over the first light-emitting layer; a second light-emitting layer over the second layer with high conductivity; and an upper electrode over the second light-emitting layer. In the embodiment of the present invention, the conductivity of each of the first layer with high conductivity and the second layer with high conductivity is higher than the conductivity of each of the first light-emitting layer and the second light-emitting layer and is lower than conductivity of each of the first lower electrode, the second lower electrode, and the upper electrode; the partition includes a first slope located on a first lower electrode side and a second slope located on a second lower electrode; and the thickness of the first layer with high conductivity located over the first slope in a direction perpendicular to the first slope is different from the thickness of the first layer with high conductivity located over the second slope in a direction perpendicular to the second slope.

In the above embodiment of the present invention, the thickness of the second layer with high conductivity located over the first slope in a direction perpendicular to the first slope is preferably different from the thickness of the second layer with high conductivity located over the second slope in a direction perpendicular to the second slope.

In the above embodiment of the present invention, of the thickness of the layer with high conductivity located over the first slope in the direction perpendicular to the first slope and the thickness of the layer with high conductivity located over the second slope in the direction perpendicular to the second slope, a smaller thickness is preferably less than or equal to ½ of a larger thickness.

In the above embodiment of the present invention, a smaller thickness of the thickness of the layer with high conductivity located over the first slope in the direction perpendicular to the first slope and the thickness of the layer with high conductivity located over the second slope in the direction perpendicular to the second slope is preferably less than or equal to ½ of the thickness of the layer with high conductivity located over the first lower electrode in a direction perpendicular to the first lower electrode.

In the above embodiment of the present invention, of the thickness of the first layer with high conductivity located over the first slope in the direction perpendicular to the first slope and the thickness of the first layer with high conductivity located over the second slope in the direction perpendicular to the second slope, a smaller thickness is less than or equal to ½ of a larger thickness.

In the above embodiment of the present invention, a smaller thickness of the thickness of the first layer with high conductivity located over the first slope in the direction perpendicular to the first slope and the thickness of the first layer with high conductivity located over the second slope in the direction perpendicular to the second slope is preferably less than or equal to ½ of the thickness of the first layer with high conductivity located over the first lower electrode in the direction perpendicular to the first lower electrode.

In the above embodiment of the present invention, of the thickness of the second layer with high conductivity located over the first slope in the direction perpendicular to the first slope and the thickness of the second layer with high conductivity located over the second slope in the direction perpendicular to the second slope, a smaller thickness is preferably less than or equal to ½ of a larger thickness.

In the above embodiment of the present invention, a smaller thickness of the thickness of the second layer with high conductivity located over the first slope in the direction perpendicular to the first slope and the thickness of the second layer with high conductivity located over the second slope in the direction perpendicular to the second slope is preferably less than or equal to ½ of the thickness of the second layer with high conductivity located over the first lower electrode in a direction perpendicular to the first lower electrode.

Further, a color of light emitted from the light-emitting layer of the first light-emitting element is preferably different from a color of light emitted from the light-emitting layer of the second light-emitting element.

In the above embodiment of the present invention, it is preferable that the plurality of first light-emitting elements emitting light of a first color be arranged in a form of a line; the plurality of second light-emitting elements emitting light of a second color be arranged in a form of a line; each of the plurality of first light-emitting elements include the light-emitting layer of the first light-emitting element; each of the plurality of second light-emitting elements include the light-emitting layer of the second light-emitting element; and the partition be provided between each of the plurality of first light-emitting elements and each of the plurality of second light-emitting elements.

In the above embodiment of the present invention, it is preferably that a color filter over the upper electrode be provided, the color filter include a region having a first color which overlaps with the first lower electrode and a region having a second color which overlaps with the second lower electrode; and the first color be different from the second color.

In the above embodiment of the present invention, it is preferable that a plurality of first light-emitting elements emitting light of a first color be arranged in a form of a line; a plurality of second light-emitting elements emitting light of a second color be arranged in a form of a line; each of the plurality of first light-emitting elements include the first light-emitting layer and the second light-emitting layer located between the first lower electrode and the upper electrode; each of the plurality of second light-emitting elements include the first light-emitting layer and the second light-emitting layer located between the second lower electrode and the upper electrode; and the partition be provided between each of the plurality of first light-emitting elements and each of the plurality of second light-emitting elements.

One embodiment of the present invention is a method for manufacturing a light-emitting device, including the steps of preparing a substrate that is obtained in such a manner that a first lower electrode and a second lower electrode are formed on a substrate and a partition is formed between the first lower electrode and the second lower electrode; and forming a layer with high conductivity over each of the first lower electrode, the partition, and the second lower electrode in such a manner that an evaporation substance generated from an evaporation source flies in an oblique direction to a surface of the substrate. In the embodiment of the present invention, the conductivity of the layer with high conductivity is lower than conductivity of each of the first lower electrode and the second lower electrode; the partition includes a first slope located on the first lower electrode side and a second slope located on the second lower electrode side; and the thickness of the layer with high conductivity located over the first slope in a direction perpendicular to the first slope is different from the thickness of the layer with high conductivity located over the second slope in a direction perpendicular to the second slope.

One embodiment of the present invention is a method for manufacturing a light-emitting device, including the steps of: preparing a substrate obtained in such a manner that a plurality of first lower electrodes and a plurality of second lower electrodes are each arranged in a form of a line over a substrate and a partition is formed between each of the plurality of first lower electrodes and each of the plurality of second lower electrodes; and forming a layer with high conductivity over each of the plurality of first lower electrodes, the partitions, and the plurality of second lower electrodes in such a manner that an evaporation substance generated from an evaporation source flies in an oblique direction to a surface of the substrate. In the embodiment of the present invention, the oblique direction is a direction crossing the line; the conductivity of the layer with high conductivity is lower than the conductivity of each of the plurality of first lower electrodes and the plurality of second lower electrodes; the partitions each include a first slope located on the corresponding first lower electrode side and a second slope located on the corresponding second lower electrode side; and the thickness of the layer with high conductivity located over the first slope in a direction perpendicular to the first slope is different from the thickness of the layer with high conductivity located over the second slope in a direction perpendicular to the second slope.

In the above embodiment of the present invention, it is preferable that the flying of the evaporation substance in the oblique direction to the surface of the substrate indicate that the evaporation substance which is generated from the evaporation source is blocked by a mask having a slit which is provided between the evaporation source and the substrate and the evaporation substance which passes through the slit flies in the oblique direction to the surface of the substrate.

The above embodiment of the present invention further including the steps of: forming a light-emitting layer over the layer with high conductivity to be located over each of the first lower electrode and the second lower electrode, after the layer with high conductivity is formed; and forming an upper electrode over the light-emitting layer. In the embodiment of the present invention, it is preferable that the conductivity of the layer with high conductivity be higher than the conductivity of the light-emitting layer and be lower than conductivity of the upper electrode.

According to one embodiment of the present invention, a crosstalk phenomenon can be prevented from occurring in a light-emitting device including a tandem element or a single element.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the invention should not be construed as being limited to the description in the following embodiments.

[Embodiment 1]

Figure 1A:
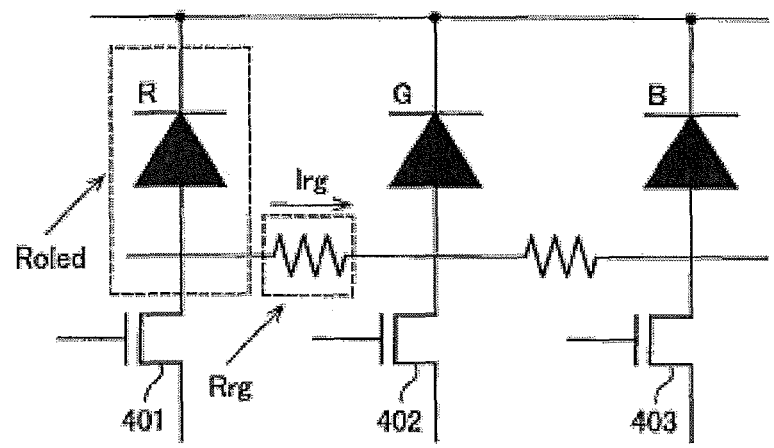
FIG. 1A is a circuit diagram illustrating a light-emitting device of one embodiment of the present invention.
Figure 1B:
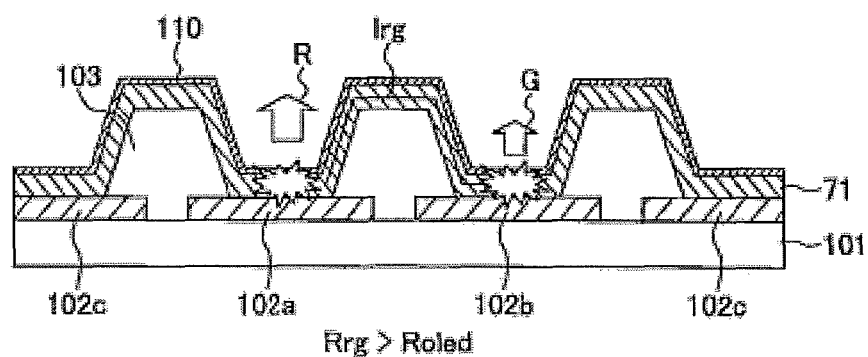
FIG. 1B is a cross-sectional view schematically illustrating a light-emitting device as a comparative example.
Figure 1C:
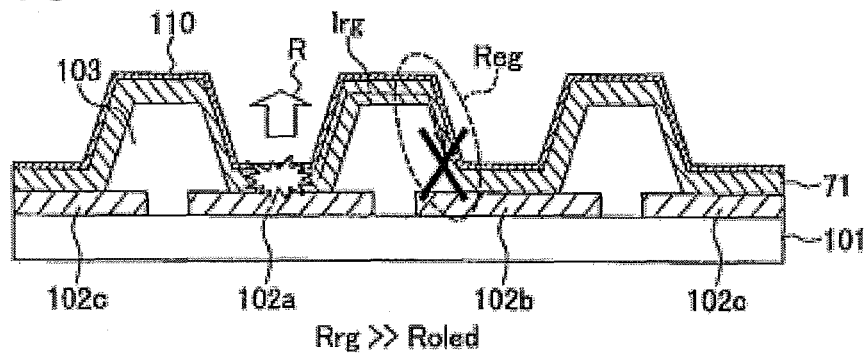
FIG. 1C is a cross-sectional view schematically illustrating a light-emitting device of one embodiment of the present invention.
Figure 2A:
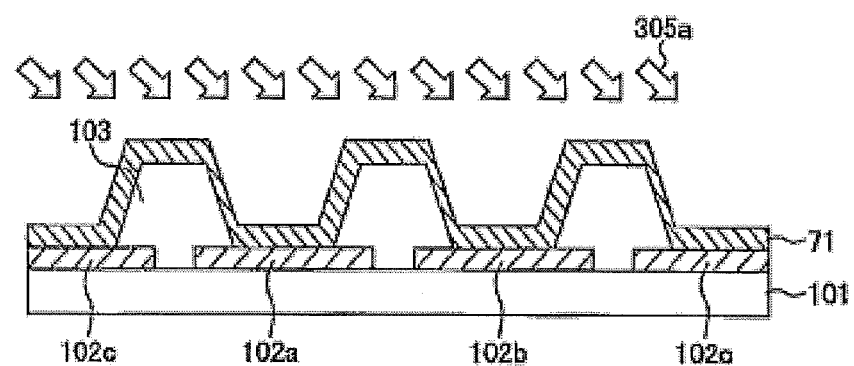
FIG. 2A is a cross-sectional view for describing a method for manufacturing a light-emitting device of one embodiment of the present invention.
Figure 2B:
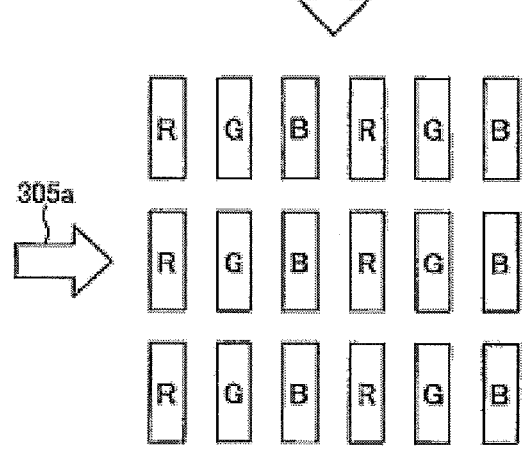
FIG. 2B is a plan view of the light-emitting device of FIG. 2A.

FIG. 1A is a circuit diagram illustrating a light-emitting device of one embodiment of the present invention, FIG. 1B is a cross-sectional view schematically illustrating a light-emitting device as a comparative example, and FIG. 1C is a cross-sectional view schematically illustrating a light-emitting device of one embodiment of the present invention. FIG. 2A is a cross-sectional view for describing a method for manufacturing a light-emitting device of one embodiment of the present invention, and FIG. 2B is a plan view of the light-emitting device of FIG. 2A.

The light-emitting device illustrated in FIG. 1A includes an organic EL element (OLED element) R emitting red light, an organic EL element (OLED element) G emitting green light, and an organic EL element (OLED element) B emitting blue light. A transistor 401, a transistor 402, and a transistor 403 are connected to the organic EL element R, the organic EL element G, and the organic EL element B, respectively.

Each of the light-emitting devices illustrated in FIGS. 1B and 1C includes a substrate 101. Transistors are formed over the substrate 101, and a first lower electrode 102a, a second lower electrode 102b, and a third lower electrode 102c serving as lower electrodes (e.g., anodes) which are electrically connected to the transistors with a connection electrode such as a transparent electrode are formed over the transistors with an interlayer insulating film provided therebetween. Partitions 103 are formed between the first lower electrode 102a, the second lower electrode 102b, and the third lower electrode 102c. The first lower electrode 102a, the second lower electrode 102b, and the third lower electrode 102c are separated into island shapes to be electrically separated from each other. An EL layer 71 which includes a layer with high conductivity and a light-emitting layer is formed over the partitions 103, the first lower electrode 102a, the second lower electrode 102b, and the third lower electrode 102c by an evaporation method. An upper electrode 110 (e.g., a cathode) is formed over the EL layer 71 by an evaporation method.

The EL layer 71 is formed over the entire surface of the substrate 101 by an evaporation method; therefore, the EL layer 71 formed over the partitions 103 has a substantially uniform thickness as illustrated in FIG. 1B. Therefore, the value of resistance Rrg between adjacent pixels is too small to be ignored as compared to resistance Roled of the OLED elements R, G, and B depending on the resistivity of the layer with high conductivity in the EL layer 71, so that leakage current Irg flows between the adjacent pixels (see FIG. 1A). For example, in the case where the OLED element R emits red light, the leakage current Irg flows between the adjacent pixels, so that a crosstalk phenomenon in which the adjacent OLED element G also emits green light occurs (see FIGS. 1A and 1B).

Thus, as illustrated in FIG. 1C and FIG. 2A, the layer with high conductivity which can serve as a current path is deposited in such a manner that an evaporation substance generated from an evaporation source flies in an oblique direction to the surface of the substrate 101 (arrows 305a).

Here, a slope which is not shadowed by the partition 103 (i.e., a left-side slope of the partition 103 in FIG. 1C) is referred to as a first slope, and the thickness of the EL layer which includes the light-emitting layer and the layer with high conductivity and which is deposited over the first slope in a direction perpendicular to the first slope is referred to as a first total thickness. A slope which is shadowed by the partition 103 (i.e., a right-side slope of the partition 103 in FIG. 1C) is referred to as a second slope, and the thickness of the EL layer which is deposited over the second slope in a direction perpendicular to the second slope is referred to as a second total thickness. The thickness of the EL layer deposited over each of the first lower electrode 102a, the second lower electrode 102b, and the third lower electrode 102c in a direction perpendicular to the lower electrode is referred to as a third total thickness.

At this time, the layer with high conductivity which can serve as a current path is deposited so that the evaporation substance generated from the evaporation source flies in the oblique direction to the surface of the substrate 101 (the arrows 305a), whereby the second total thickness can be smaller than each of the first total thickness and the third total thickness. Further, the first total thickness can be larger than the third total thickness. That is, the first total thickness, the second total thickness, and the third total thickness can be different from one another.

Specifically, the following structure can be employed. The thickness of the layer with high conductivity which is deposited over the first slope in the direction perpendicular to the first slope is referred to as a first thickness. The thickness of the layer with high conductivity deposited over the second slope in the direction perpendicular to the second slope is referred to as a second thickness. The thickness of the layer with high conductivity deposited over each of the first lower electrode 102a, the second lower electrode 102b, and the third lower electrode 102c in the direction perpendicular to the lower electrode is referred to as a third thickness. At this time, the second thickness can be smaller than each of the first thickness and the third thickness. In addition, the first thickness can be larger than the third thickness.

It is preferable that the second total thickness or the second thickness is less than or equal to ½ of each of the first total thickness or the first thickness and the third total thickness or the third thickness. With such thicknesses, the resistance Rrg between the adjacent pixels is large enough to be ignored as compared to the resistance Roled of the OLED element; therefore, the leakage current Irg to the adjacent pixel can be reduced.

As a result, generation of a crosstalk phenomenon can be prevented, so that display quality can be improved. Note that in this specification, the thickness of a layer in a direction perpendicular to a slope refers to the largest thickness of the layer over the slope.

As described above, when the layer with high conductivity in the EL layer 71, e.g., a hole-injection layer and an intermediate layer are evaporated in the oblique direction (the arrows 305a) so that the thickness of the layer with high conductivity over the slope of the partition is reduced, the resistance of the layer with high conductivity over the slope of the partition can be increased, and as a result, generation of a crosstalk phenomenon can be prevented. When such a light-emitting device is used for an organic EL display, the organic EL display in which measures against a crosstalk phenomenon are taken can be manufactured.

When pixels of the organic EL display have a stripe structure as illustrated in FIG. 2B, the oblique direction in which evaporation is performed is preferably the direction of the arrow 305a. In other words, in a stripe structure in which a plurality of red pixels R and lower electrodes thereof are arranged in the form of a line, a plurality of green pixels G and lower electrodes thereof are arranged in the form of a line, and a plurality of blue pixels B and lower electrodes thereof are arranged in the form of a line, the evaporation direction (the arrow 305a) preferably intersects the lines. Accordingly, crosstalk in a lateral direction (crosstalk among different colors) can be prevented and a reduction in NTSC ratio can be prevented. Meanwhile, when oblique evaporation from a direction of an arrow 305b (a direction which does not intersect the lines) is performed, crosstalk in a longitudinal direction (crosstalk of the same color) can be prevented but the crosstalk in the lateral direction cannot be prevented; therefore, the color mixing occurs and the NTSC ratio is reduced.

Note that the EL layer 71 can have a variety of structures and specifically may have the following structure. For example, a single element including the EL layer 71 in which a layer with high conductivity, a light-emitting layer, and the like are stacked as appropriate, or a tandem element in which a plurality of EL layers including layers with high conductivity are stacked with an intermediate layer therebetween may be used.

A layer with low conductivity included in the EL layer 71 and the upper electrode 110 causing a problem of a drop in voltage are preferably deposited from a front direction of the substrate 101 so that an increase in resistance of the layer over the slope of the partition is prevented.

Figure 3:
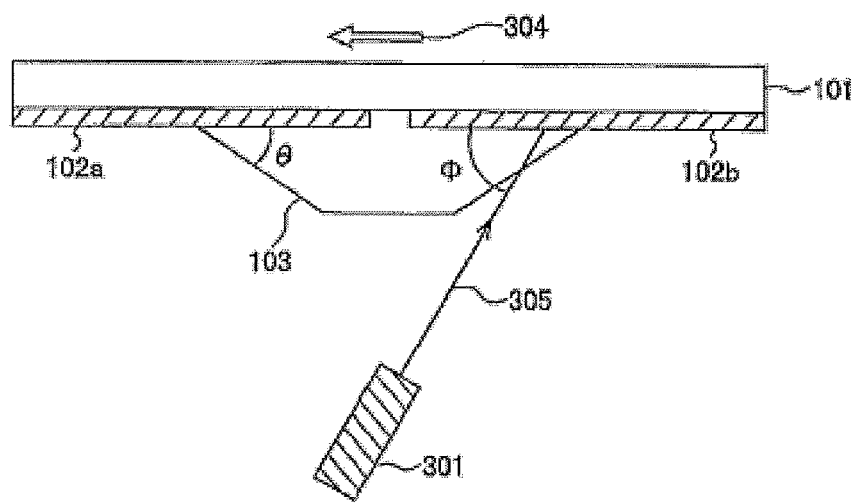
FIG. 3 is a cross-sectional view illustrating an example of a method for manufacturing a light-emitting device of one embodiment of the present invention.

FIG. 3 is a cross-sectional view illustrating an example of a method for manufacturing the light-emitting device of one embodiment of the present invention. FIG. 3 shows a relation between an evaporation angle and an angle of the partition at the time when the layer with high conductivity is deposited from the oblique direction to the substrate 101. FIG. 3 schematically illustrates an inclined evaporation source 301 for easy understanding.

When a flying angle of an evaporation substance is simplified to Φ and the thickness of the layer with high conductivity over the slope of the partition 103 is t, the following formula (1) is satisfied.

$$t = R \sin(\Phi - \theta) \quad (1)$$

R: the thickness of the layer with high conductivity in the case where the evaporation source 301 and the substrate 101 are perpendicular to each other.

Φ: the angle formed by an evaporation direction (an arrow 305) and the substrate 101.

θ: an angle of the slope of the partition 103 to the first lower electrode 102a, the second lower electrode 102b, or the substrate 101.

When a thickness of the layer with high conductivity which can prevent a crosstalk phenomenon from occurring is α, the above formula becomes the following formulae (2) and (3).

$$R \sin(\Phi - \theta) < \alpha \quad (2)$$

$$\sin(\Phi - \theta) < \alpha/R \quad (3)$$

That is, the evaporation angle Φ and the angle θ of the slope of the partition are set so as to satisfy the conditions of the above formula (3), and the evaporation substance flies from the evaporation source 301 in the direction of the arrow 305 while the substrate 101 is moved in a direction of an arrow 304. In this manner, the layer with high conductivity is deposited over the partition 103, the first lower electrode 102a, and the second lower electrode 102b by an evaporation method. Accordingly, the thickness of the layer with high conductivity, i.e., each of the electron-injection layer, the electron-transport layer, the hole-injection layer, the hole transport layer, and the intermediate layer over one slope of the partition 103 can be reduced. Further, in a similar manner to the relation of the thickness of the layer with high conductivity, a relation of the thickness of the EL layer including the layer with high conductivity is also satisfied.

The thickness α of the layer with high conductivity which can prevent generation of a crosstalk phenomenon can be determined freely by a material to be used or the element structure.

Figure 4A:
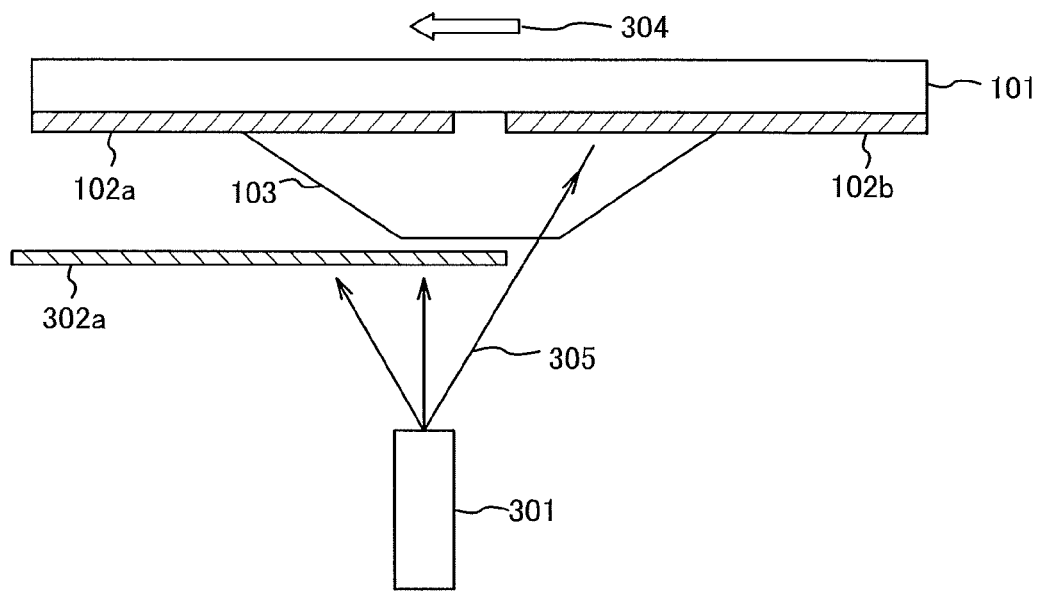
FIGS. 4A and 4B are cross-sectional views each illustrating an example of a method for manufacturing a light-emitting device of one embodiment of the present invention.
Figure 4B:
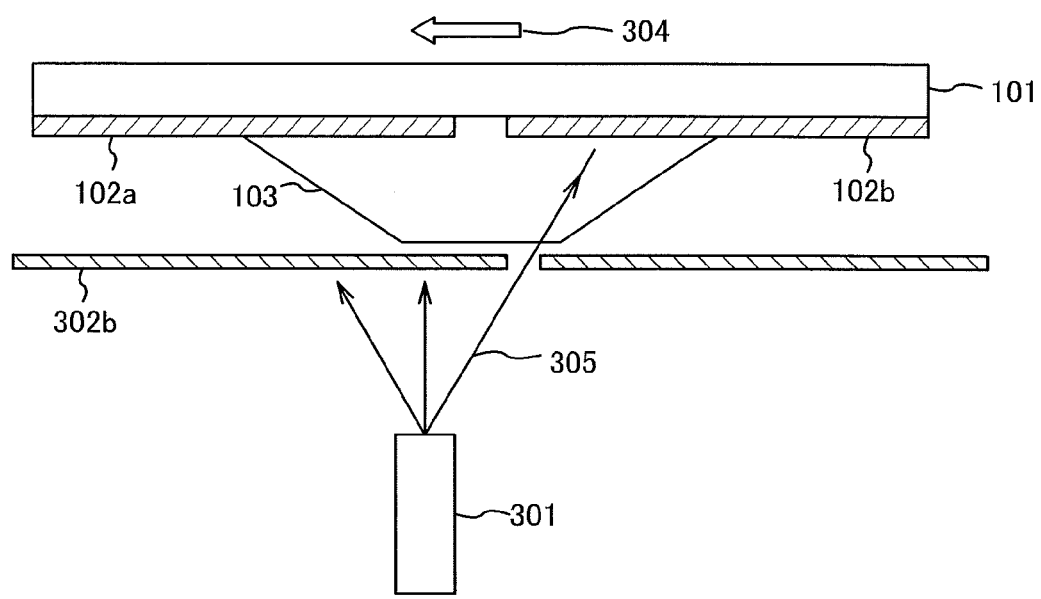

FIGS. 4A and 4B are cross-sectional views each illustrating an example of the method for manufacturing the light-emitting device of one embodiment of the present invention. As illustrated in FIGS. 4A and 4B, deposition may be performed in a state where the evaporation source 301 is positioned perpendicular to the substrate 101 and a mask 302a or a mask 302b is provided between the substrate 101 and the evaporation source 301.

In FIG. 4A, the mask 302a which blocks part of the evaporation substance is provided between the evaporation source 301 and the substrate 101. Therefore, the evaporation substance generated from the evaporation source 301 flies in an oblique direction (the arrow 305) to the surface of the substrate 101. Then, the substrate 101 is moved in a horizontal direction (the arrow 304) over the mask 302a, whereby only an evaporation substance which flies in an oblique direction with an angle within a certain range can be attached to the substrate. Accordingly, the thickness of the layer with high conductivity deposited over one slope of the partition 103 can be reduced.

In order that the evaporation substance is deposited more uniformly, the mask 302b which has a slit may be used as illustrated in FIG. 4B. When the mask 302b having a slit is provided between the evaporation source 301 and the substrate 101, only the evaporation substance which flies in an oblique direction with the certain angle can be attached to the substrate, so that the evaporation substance can be deposited over the substrate 101 more uniformly.

[Embodiment 2]

Examples of a light-emitting device of one embodiment of the present invention are described with reference to FIGS. 5A to 5C and FIGS. 6A to 6C.

<Light-emitting Element Having Single Structure>

Figure 5A:
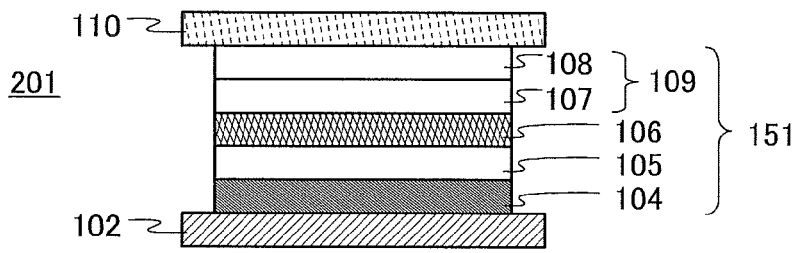
FIG. 5A is a cross-sectional view of a light-emitting element having a single structure of one embodiment of the present invention.

FIG. 5A illustrates a light-emitting element 201 as an example of a single element. The light-emitting element 201 includes an electrode 102 serving as an anode, and an upper electrode 110 serving as a cathode, and an EL layer 151 which is provided between the electrode 102 and the upper electrode 110. The EL layer 151 includes, from the electrode 102 side, a hole-injection layer 104, a hole-transport layer 105, a light-emitting layer 106, an electron-transport layer 107, and an electron-injection layer 108. The electron-transport layer 107 and the electron-injection layer 108 are collectively referred to as a layer 109 in FIGS. 5B and 5C for simplification of the drawings.

<Bottom-emission-type Light-emitting Element Having Single Structure and Oblique Evaporation of Hole-injection Layer>

Figure 5B:
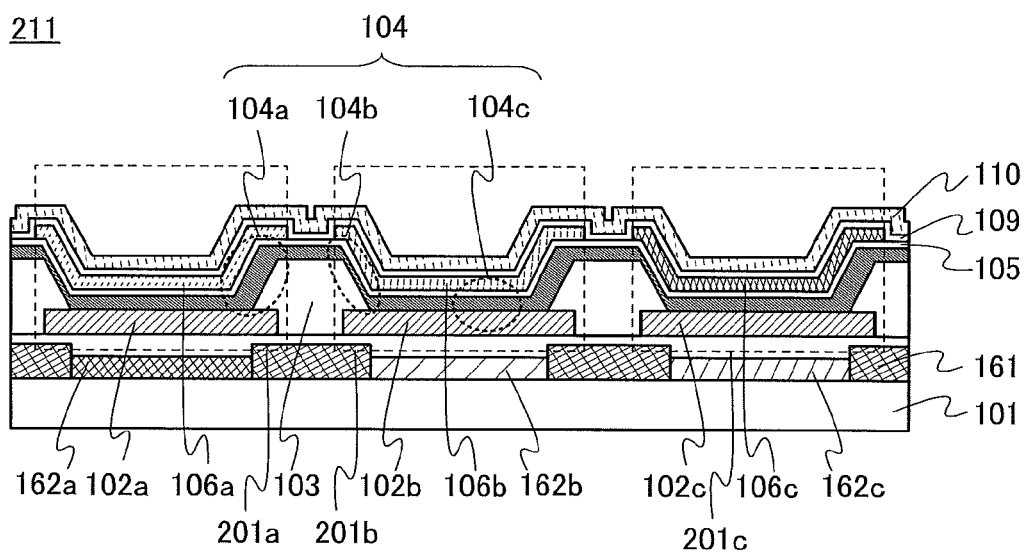
FIG. 5B is a cross-sectional view of a bottom-emission-type light-emitting element having a single structure of one embodiment of the present invention.

FIG. 5B illustrates a cross section of part of a light-emitting device 211 of a bottom-emission type which includes a first light-emitting element 201a, a second light-emitting element 201b, and a third light-emitting element 201c. The first light-emitting element 201a, the second light-emitting element 201b, and the third light-emitting element 201c have different emission colors and include a light-emitting layer 106a, a light-emitting layer 106b, and a light-emitting layer 106c, respectively. The first light-emitting element 201a, the second light-emitting element 201b, and the third light-emitting element 201c respectively include a first lower electrode 102a, a second lower electrode 102b, and a third lower electrode 102c which are separated to have island shapes and include the hole-injection layer 104, the hole-transport layer 105, the layer 109 (the electron-transport layer 107 and the electron-injection layer 108), and the upper electrode 110 which are common thereto; and the these components are stacked in this order. The light-emitting layer 106a, the light-emitting layer 106b, and the light-emitting layer 106c are located over the first lower electrode 102a, the second lower electrode 102b, and the third lower electrode 102c, respectively. The hole-injection layer 104, the hole-transport layer 105, the layer 109 (the electron-transport layer 107 and the electron-injection layer 108), and the upper electrode 110 which are common are also formed over the top surfaces and the slopes of the partitions 103 and are separated for each light-emitting element by the partitions 103.

Specifically, in the first light-emitting element 201a, the first lower electrode 102a separated into an island-shape, the hole-injection layer 104 that is common to other light-emitting elements, the hole-transport layer 105 that is common to other light-emitting elements, the light-emitting layer 106a, the layer 109 (the electron-transport layer 107 and the electron-injection layer 108) that is common to other light-emitting elements, and the upper electrode 110 that is common to other light-emitting elements are stacked in this order over the substrate 101. Similarly, in the second light-emitting element 201b, the second lower electrode 102b separated into an island-shape, the hole-injection layer 104 that is common to other light-emitting elements, the hole-transport layer 105 that is common to other light-emitting elements, the light-emitting layer 106b, the layer 109 (the electron-transport layer 107 and the electron-injection layer 108) that is common to other light-emitting elements, and the upper electrode 110 that is common to other light-emitting elements are stacked in this order over the substrate 101. Similarly, in the third light-emitting element 201c, the third lower electrode 102c separated into an island-shape, the hole-injection layer 104 that is common to other light-emitting elements, the hole-transport layer 105 that is common to other light-emitting elements, the light-emitting layer 106c, the layer 109 (the electron-transport layer 107 and the electron-injection layer 108) that is common to other light-emitting elements, and the upper electrode 110 that is common to other light-emitting elements are stacked in this order over the substrate 101. The emission colors of the light-emitting layer 106a, the light-emitting layer 106b, and the light-emitting layer 106c can be different from each other. For example, the light-emitting layer 106a, the light-emitting layer 106b, and the light-emitting layer 106c may emit light of R, light of G, and light of B, respectively (without limitation to having R, G, and B, they may have different wavelengths).

Further, it is preferable that a color filter 162a be provided between the substrate 101 and the first lower electrode 102a.

When light is extracted through the substrate 101, the color purity of the light can be improved. Similarly, it is preferable that a color filter 162b be provided between the substrate 101 and the second lower electrode 102b, and a color filter 162c be provided between the substrate 101 and the third lower electrode 102c. In addition, a light-blocking layer 161 is preferably provided between the color filters. The color filters 162a, 162b, and 162c may have different colors; for example, the color filters 162a, 162b, and 162c can correspond to R, G, and B, respectively (without limitation to having R, G, and B, they may have different wavelengths).

In this embodiment, the layer with high conductivity corresponds to the hole-injection layer 104 and the hole-transport layer 105 which are formed between the light-emitting layer and the lower electrode and the partition, and the electron-transport layer 107 and the electron-injection layer 108 which are formed between the light-emitting layer (the light-emitting layers 106a, 106b, and 106c) and the upper electrode 110. The partition 103 includes a first slope (a region 104a) located on the first lower electrode side and a second slope (a region 104b) located on the second lower electrode side. The thickness of the layer with high conductivity located over the first slope (the region 104a) in a direction perpendicular to the first slope is different from the thickness of the layer with high conductivity located over the second slope (the region 104b) in a direction perpendicular to the second slope. These thicknesses are each different from the thickness of the layer with high conductivity in a direction perpendicular to the lower electrode (a region 104c). In this embodiment, the order of thickness from the largest to the smallest is the region 104a, the region 104c, and the region 104b. Specific description is made below using the hole-injection layer 104.

A relation among the thickness of the hole-injection layer 104 in the direction perpendicular to the first slope in the region 104a in contact with the first slope on the first light-emitting element 201a side of the partition 103, the thickness of the hole-injection layer 104 in the direction perpendicular to the second slope in the region 104b in contact with the second slope on the second light-emitting element 201b side of the partition 103, and the thickness of the hole-injection layer 104 in the direction perpendicular to the second lower electrode 102b in the region 104c in contact with the second lower electrode 102b is as follows:

region 104a>region 104c>region 104b
region 104a=R sin($\Phi+\theta$)
region 104c=R sin $\Phi$
region 104b=R sin ($\Phi-\theta$)

According to the above formulae, the evaporation angle $\Phi$ and the angle $\theta$ of the slope of the partition are set so as to satisfy a relation of tan $\Phi$<sin $\theta$/(1−cos $\theta$). For example, when the angle of the slope of the partition is 20°, the evaporation angle is less than or equal to 80°; when the angle of the slope of the partition is 40°, the evaporation angle is less than or equal to 70°; when the angle of the slope of the partition is 50°, the evaporation angle is less than or equal to 65°; and when the angle of the slope of the partition is 55°, the evaporation angle is less than or equal to 62.5°.

Further, the thickness of the hole-injection layer 104 in the direction perpendicular to the second slope in the region 104b is, as described below, preferably less than or equal to ½ of the thickness of the hole-injection layer 104 in the direction perpendicular to the second lower electrode 102b in the region 104c. Further, the thickness of the hole-injection layer 104 in the direction perpendicular to the second slope in the region 104b is preferably less than or equal to ½ of the thickness of the hole-injection layer 104 in the direction perpendicular to the first slope in the region 104a. Note that a region of the region 104b where the hole-injection layer 104 is not formed (also referred to as disconnection of the hole-injection layer 104) may exist.

region 104a/2>region 104c/2>region 104b
region 104a=R sin ($\Phi+\theta$)
region 104c=R sin $\Phi$ region 104b=R sin ($\Phi-\theta$)

According to the above formulae, the evaporation angle $\Phi$ and the angle $\theta$ of the slope of the partition are set so as to satisfy a relation of tan $\Phi$<sin $\theta$/(cos $\theta$−½)& sin $\theta$/(1−cos $\theta$). For example, when the angle of the slope of the partition is 20°, the evaporation angle is less than or equal to 38°; when the angle of the slope of the partition is 40°, the evaporation angle is less than or equal to 68°; when the angle of the slope of the partition is 50°, the evaporation angle is less than or equal to 65°; and when the angle of the slope of the partition is 55°, the evaporation angle is less than or equal to 62.5°.

In the above manner, when the thickness of the hole-injection layer 104 in the region 104b is reduced, the resistance Rrg between the light-emitting elements (in this case, between the first light-emitting element 201a and the second light-emitting element 201b) can be increased. Accordingly, the resistance Rrg between the light-emitting elements can be large enough to be regarded as an insulated condition as compared to the resistance Roled of the light-emitting element; therefore, current leakage to another light-emitting element can be prevented.

Although the thickness of the hole-injection layer 104 is described above, the same applies to the thickness of another layer with high conductivity, i.e., the thicknesses of the electron-injection layer 108, the electron-transport layer 107, the hole-transport layer 105, and an intermediate layer 142 described later.

<Top-emission-type Light-emitting Element Having Single Structure and Oblique Evaporation of Hole-injection Layer>

Figure 5C:
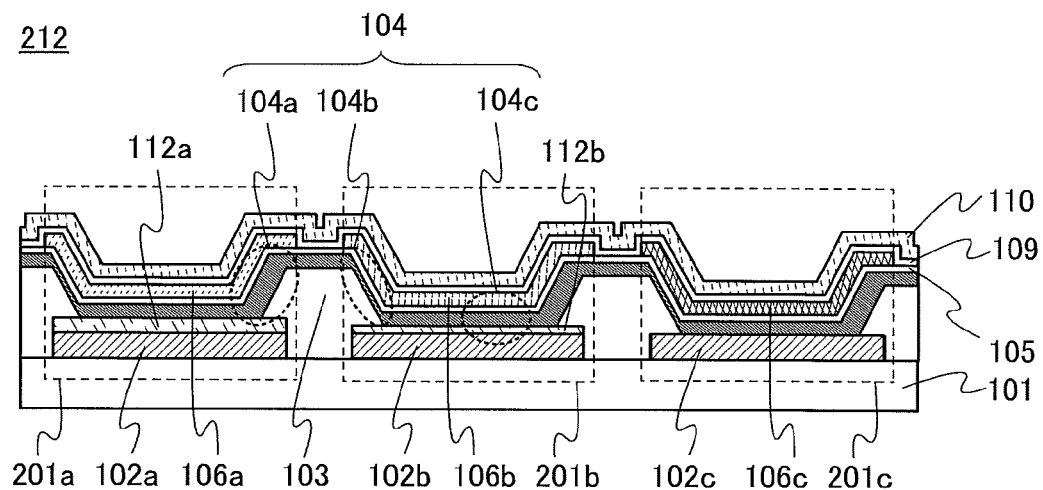
FIG. 5C is a cross-sectional view of a top-emission-type light-emitting element having a single structure of one embodiment of the present invention.

Although the bottom-emission-type light-emitting element is illustrated in FIG. 5B, one embodiment of the present invention can be applied to a top-emission-type light-emitting element illustrated in FIG. 5C. In the case where the top-emission-type light-emitting element is used, transparent conductive layers 112a and 112b whose thicknesses vary between elements emitting different colors are preferably provided over the first lower electrode 102a, the second lower electrode 102b, and the third lower electrode 102c. For example, in FIG. 5C, among the first light-emitting element 201a, the second light-emitting element 201b, and the third light-emitting element 201c in a light-emitting device 212, the first light-emitting element 201a emits light having the longest wavelength, the second light-emitting element 201b emits light having a wavelength intermediate between the first light-emitting element 201a and the third light-emitting element 201c, and the third light-emitting element 201c emits light having the shortest wavelength. In this case, it is preferable that the transparent conductive layer 112a be provided over the first lower electrode 102a of the first light-emitting element 201a, and the transparent conductive layer 112b which is thinner than the transparent conductive layer 112a be provided over the second lower electrode 102b of the second light-emitting element 201b. A transparent conductive layer which is thinner than the transparent conductive layer 112b may be provided over the third lower electrode 102c of the third light-emitting element 201c or the transparent conductive layer is not provided as illustrated in FIG. 5C.

Note that the top-emission-type light-emitting element in FIG. 5C has a structure similar to that of the bottom-emission-type light-emitting element in FIG. 5B except that the transparent conductive layers 112a and 112b are provided.

When the transparent layers which differ in thickness are provided in the respective elements which emit different colors, the thickness of each light-emitting element can be appropriately designed so as to be a thickness which resonates with the wavelength of a desired color. Accordingly, the color purity of each light-emitting element can be improved.

Although not illustrated, a color filter is preferably provided on the counter glass substrate overlapping with each light-emitting element. When color filters having different colors are provided for the respective light-emitting elements, the color purity of light extracted to the counter substrate side can be improved.

Alternatively, the light-emitting device including the light-emitting elements having the single structure of one embodiment of the present invention may be the one in which a plurality of first light-emitting elements 201a is arranged in the form of a line, a plurality of second light-emitting elements 201b is arranged in the form of a line, a plurality of third light-emitting elements 201c is arranged in the form of a line, the partition 103 is provided between each of the plurality of first light-emitting elements 201a and each of the plurality of second light-emitting elements 201b, and the partition 103 is provided between each of the plurality of second light-emitting elements 201b and each of the plurality of third light-emitting elements 201c.

<Light-emitting Element Having Tandem Structure>

Figure 6A:
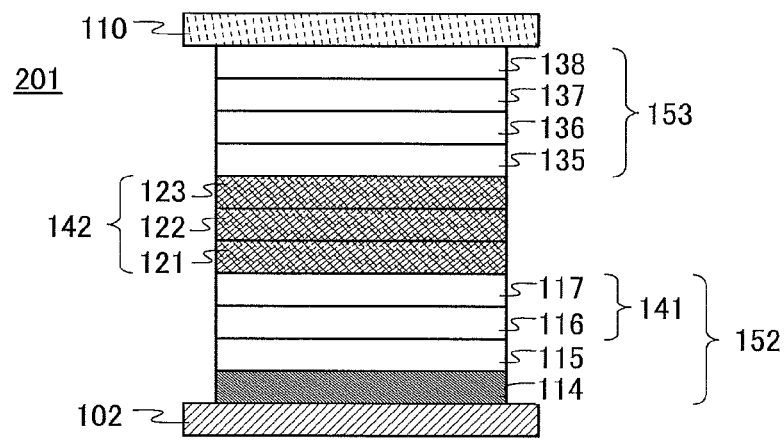
FIG. 6A is a cross-sectional view of a light-emitting element having a tandem structure of one embodiment of the present invention.

FIG. 6A illustrates the light-emitting element 201 as an example of a tandem element. In the light-emitting element 201, two EL layers, i.e., an EL layer 152 and an EL layer 153 are provided between the electrode 102 serving as an anode and the upper electrode 110 serving as a cathode. The intermediate layer 142 is provided between the EL layer 152 and the EL layer 153. In the tandem structure, unlike in the single structure, a light-emitting layer can be common to a plurality of adjacent light-emitting elements without being separated into island shapes.

The EL layer 152 includes a hole-injection layer 114, a hole-transport layer 115, a first light-emitting layer 116, and an electron-transport layer 117. The hole-injection layer 114 and the hole-transport layer 115 are collectively referred to as a layer 140 in FIGS. 6B and 6C for simplification of the drawings. Further, the first light-emitting layer 116 and the electron-transport layer 117 are collectively referred to as a layer 141.

The intermediate layer 142 includes an electron-injection buffer layer 121, an electron-relay layer 122, and a charge generation layer 123. The electron-injection buffer layer 121, the electron-relay layer 122, and the charge generation layer 123 are collectively referred to as the intermediate layer 142 in FIGS. 6B and 6C for simplification of the drawings.

The EL layer 153 includes a hole-transport layer 135, a second light-emitting layer 136, an electron-transport layer 137, and an electron-injection layer 138. The hole-transport layer 135, the second light-emitting layer 136, the electron-transport layer 137, and the electron-injection layer 138 are collectively referred to as the EL layer 153 in FIGS. 6B and 6C for simplification of the drawings. For example, the first light-emitting layer 116 may be a light-emitting layer with blue emission and the second light-emitting layer 136 may be a light-emitting layer with green and red emission (without limitation to having blue, green, and red, they may have different wavelengths).

Figure 6B:
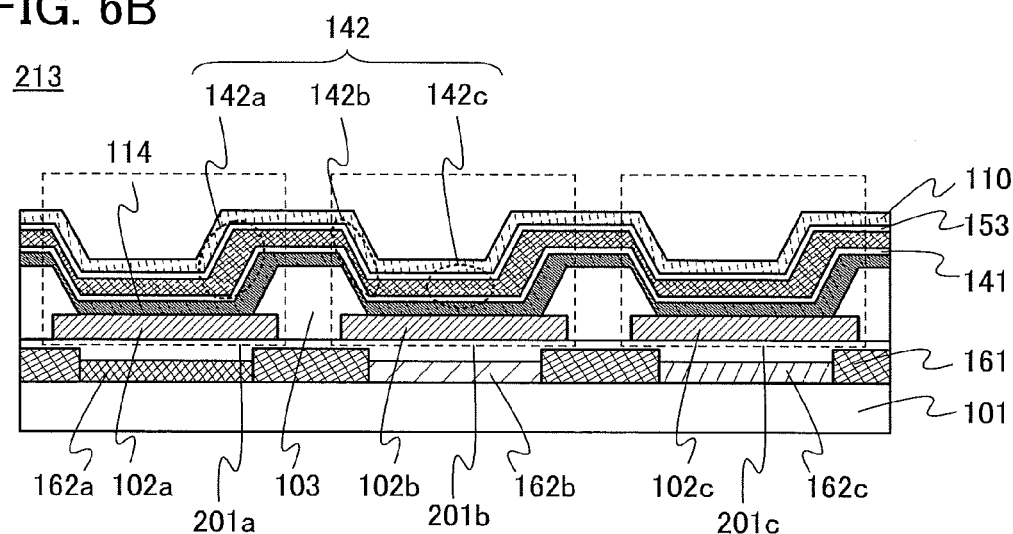
FIG. 6B is a cross-sectional view of a bottom-emission-type light-emitting element having a tandem structure of one embodiment of the present invention.

FIG. 6B illustrates a cross section including the first light-emitting element 201a, the second light-emitting element 201b, and the third light-emitting element 201c in a light emitting device 213. In the first light-emitting element 201a, the second light-emitting element 201b, and the third light-emitting element 201c, the first lower electrode 102a (or the second lower electrode 102b or the third lower electrode 102c) separated into an island shape; and the layer 140 (the hole-injection layer 114 and the hole-transport layer 115), the layer 141 (the first light-emitting layer 116 and the electron-transport layer 117), the intermediate layer 142, the EL layer 153, and the upper electrode 110 which are common to the first light-emitting element 201a, the second light-emitting element 201b, and the third light-emitting element 201c are stacked in this order. The hole-injection layer 114, the layer 141 (the first light-emitting layer 116 and the electron-transport layer 117), the intermediate layer 142, the EL layer 153, and the upper electrode 110 which are common are also formed over the top surfaces and slopes of the partitions 103 and separated for each light-emitting element by the partitions 103.

In this embodiment, the hole-injection layer 114 and the hole-transport layer 115 which are formed between the light-emitting layer and the lower electrode and the partition; and the electron-transport layer 117, the intermediate layer 142 (the electron-injection buffer layer 121, the electron-relay layer 122, and the charge generation layer 123), the hole-transport layer 135, the electron-transport layer 137, and the electron-injection layer 138 which are formed between the first light-emitting layer 116 and the upper electrode 110 are layers with high conductivity.

In the case where a plurality of layers with high conductivity is provided as in this embodiment, for example, the hole-injection layer 114 and the hole-transport layer 115 may be collectively referred to as a first layer with high conductivity and the intermediate layer 142 may be referred to as a second layer with high conductivity.

The partition 103 includes a first slope (a region 142a) located on the first lower electrode side and a second slope (a region 142b) located on the second lower electrode side. The thickness of the layer with high conductivity located over the first slope (the region 142a) in a direction perpendicular to the first slope is different from the thickness of the layer with high conductivity located over the second slope (the region 142b) in a direction perpendicular to the second slope. These thicknesses are each different from the thickness of the layer with high conductivity in a direction perpendicular to the lower electrode (a region 142c). In this embodiment, the order of thickness from the largest to the smallest is the region 142a, the region 142c, and the region 142b.

Specific description is made below using the intermediate layer 142. Here, a relation among the thickness of the intermediate layer 142 in the direction perpendicular to the first slope in the region 142a provided over the first slope on the first light-emitting element 201a side of the partition 103, the thickness of the intermediate layer 142 in the direction perpendicular to the second slope in the region 142b provided over the second slope on the second light-emitting element 201b side of the partition 103, and the thickness of the intermediate layer 142 in a direction perpendicular to the second lower electrode 102b in the region 142c provided over the second lower electrode 102b is as follows.

region 142a>region 142c>region 142b region 142a=R sin (Φ+θ)

region 142c=R sin Φ region 142b=R sin (Φ−θ)

According to the above formulae, the evaporation angle Φ and the angle θ of the slope of the partition are set so as to satisfy a relation of tan Φ<sin θ/(1−cos θ). For example, when the angle of the slope of the partition is 20°, the evaporation angle is less than or equal to 80°; when the angle of the slope of the partition is 40°, the evaporation angle is less than or equal to 70°; when the angle of the slope of the partition is 50°, the evaporation angle is less than or equal to 65°; and when the angle of the slope of the partition is 55°, the evaporation angle is less than or equal to 62.5°.

Further, the thickness of the intermediate layer 142 in the direction perpendicular to the second slope in the region 142b is, as described below, preferably less than or equal to ½ of the thickness of the intermediate layer 142 in the direction perpendicular to the second lower electrode 102b in the region 142c. Further, the thickness of the intermediate layer 142 in the direction perpendicular to the second slope in the region 142b is preferably less than or equal to ½ of the thickness of the intermediate layer 142 in the direction perpendicular to the first slope in the region 142a. Note that a region of the region 142b where the intermediate layer 142 is not formed (also referred to as disconnection of the intermediate layer 142) may exist.

region 142a/2>region 142c/2>region 142b
region 142a=R sin (Φ+θ)
region 142c=R sin Φ
region 142b=R sin (Φ−θ)

According to the above formulae, the evaporation angle Φ and the angle θ of the slope of the partition are set so as to satisfy a relation of tan Φ<sin θ/(cos θ−½)& sin θ/(1−cos θ). For example, when the angle of the slope of the partition is 20°, the evaporation angle is less than or equal to 38°; when the angle of the slope of the partition is 40°, the evaporation angle is less than or equal to 68°; when the angle of the slope of the partition is 50°, the evaporation angle is less than or equal to 65°; and when the angle of the slope of the partition is 55°, the evaporation angle is less than or equal to 62.5°.

In the above manner, when the thickness of the intermediate layer 142 in the region 142b is reduced, the resistance Rrg between the light-emitting elements (in this case, between the first light-emitting element 201a and the second light-emitting element 201b) can be increased. Accordingly, the resistance Rrg between the light-emitting elements can be large enough to be regarded as an insulated condition as compared to the resistance Roled of the light-emitting element; therefore, current leakage to another light-emitting element can be prevented.

Note that at least one of the electron-injection buffer layer 121 and the electron-relay layer 122 included in the intermediate layer 142 has the above thickness. When at least one of the electron-injection buffer layer 121 and the electron-relay layer 122 has the thickness of the above relation, current leakage to another light-emitting element can be prevented.

Although the thickness of the intermediate layer 142 is described above, the same applies to the thickness of a layer with high conductivity which causes a problem of another leakage, i.e., the thickness of the hole-injection layer 114 or the hole-transport layer 115.

When the layer with high conductivity in the region 142b has a small thickness in such a manner, the resistance Rrg between the light-emitting elements (in this case, between the first light-emitting element 201a and the second light-emitting element 201b) can be increased. Thus, the resistance Rrg between the light-emitting elements can be large enough to be regarded as an insulated condition as compared to the resistance Roled of the light-emitting element; therefore, current leakage to another light-emitting element can be prevented.

Further, the color filter 162a is provided between the substrate 101 and the first lower electrode 102a. Similarly, the color filter 162b is provided between the substrate 101 and the second lower electrode 102b, and the color filter 162c is provided between the substrate 101 and the third lower electrode 102c. In addition, a light-blocking layer 161 is preferably provided between the color filters. The color filters 162a, 162b, and 162c may have different colors; for example, the color filters 162a, 162b, and 162c can correspond to R, G, and B, respectively (without limitation to having R, G, and B, wavelengths may be different).

<Top-emission-type Light-emitting Element Having Tandem Structure and Oblique Evaporation of Intermediate Layer and Hole-injection Layer>

Figure 6C:
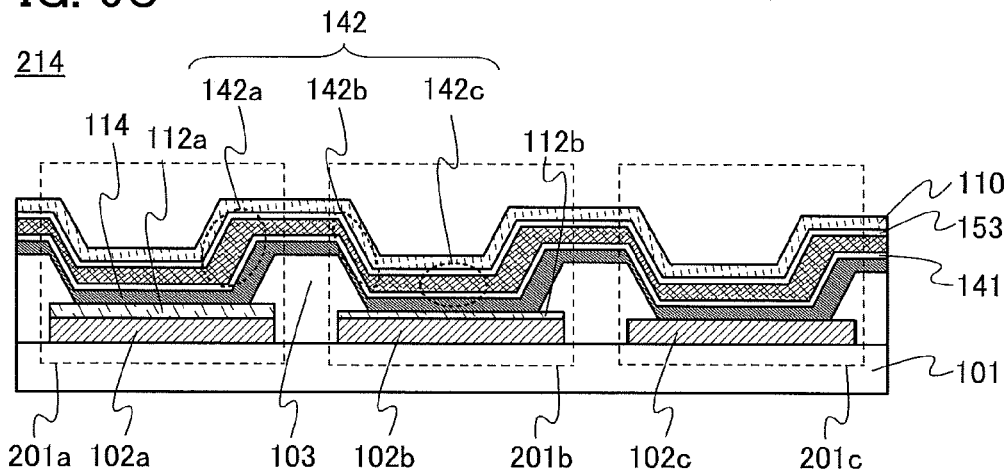
FIG. 6C is a cross-sectional view of a top-emission-type light-emitting element having a tandem structure of one embodiment of the present invention.

Although the bottom-emission-type light-emitting element is illustrated in FIG. 6B, one embodiment of the present invention can be applied to a top-emission-type light-emitting element illustrated in FIG. 6C. In the case where the top-emission-type light-emitting element is used, the transparent conductive layers 112a and 112b whose thicknesses vary are preferably provided over the first lower electrode 102a, the second lower electrode 102b, and the third lower electrode 102c. For example, in FIG. 6C, among the first light-emitting element 201a, the second light-emitting element 201b, and the third light-emitting element 201c in a light-emitting device 214, the first light-emitting element 201a is an element from which light having the longest wavelength is desirably extracted, the second light-emitting element 201b is an element from which light having a wavelength intermediate between the first light-emitting element 201a and the third light-emitting element 201c is desirably extracted, and the third light-emitting element 201c is an element from which light having the shortest wavelength is desirably extracted. In this case, it is preferable that the transparent conductive layer 112a be provided over the first lower electrode 102a of the first light-emitting element 201a, and the transparent conductive layer 112b which is thinner than the transparent conductive layer 112a be provided over the second lower electrode 102b of the second light-emitting element 201b. A transparent conductive layer which is thinner than the transparent conductive layer 112b may be provided over the third lower electrode 102c of the third light-emitting element 201c or the transparent conductive layer is not provided as illustrated in FIG. 6C.

Although not illustrated, a color filter is provided on the counter glass substrate overlapping with each light-emitting element.

Note that the top-emission-type light-emitting element in FIG. 6C has a structure similar to that of the bottom-emission-type light-emitting element in FIG. 6B except that the transparent conductive layers 112a and 112b are provided.

When the transparent layers which differ in thickness are provided in the respective elements from which different colors are desirably extracted, the thickness of each light-emitting element can be appropriately designed so as to be a thickness which resonates with the wavelength of a desired color.

The thickness of each of the intermediate layer 142 and the layer 140 (the hole-injection layer 114 and the hole-transport layer 115) varies depending on the region in FIGS. 6B and 6C; however, one embodiment of the present invention is not limited thereto. Only the thickness of the intermediate layer 142 or only the thickness of the layer 140 (hole-injection layer 114 and the hole-transport layer 115) may vary depending on the region.

Alternatively, the light-emitting device including the light-emitting elements having the tandem structure of one embodiment of the present invention may be the one in which a plurality of first light-emitting elements 201a is arranged in the form of a line, a plurality of second light-emitting elements 201b is arranged in the form of a line, a plurality of third light-emitting elements 201c is arranged in the form of a line, the partition 103 is provided between each of the plurality of first light-emitting elements 201a and each of the plurality of second light-emitting elements 201b, and the partition 103 is provided between each of the plurality of second light-emitting elements 201b and each of the plurality of third light-emitting elements 201c.

Components of the light-emitting element are described below.

<Material for Substrate>

As the substrate 101, a transparent or translucent substrate can be used in the case where light is extracted from the substrate side, and an opaque substrate can be used in the case where light of the light-emitting element is extracted from a surface on a side opposite to the substrate. A material of the substrate can be selected from glass, plastic, ceramic, a semiconductor material, a metal material whose surface is subjected to insulating treatment, and the like as appropriate; alternatively, a flexible material can be used.

<Material for Partition>

As a material of the partition 103, for example, a polyimide resin, an acrylic resin, or the like can be used. As a formation method of the partition 103, a screen printing method, a slit coating method, or the like can be employed. Further, an inorganic insulating material such as silicon oxide ($SiO_x$) can be used.

<Material for Anode>

The electrode 102 serving as an anode is preferably formed using a metal, an alloy, an electrically conductive compound, a mixture of these materials, or the like having a high work function; specifically, a work function of 4.0 eV or higher is preferable. Specifically, for example, indium tin oxide (ITO), indium tin oxide containing silicon or silicon oxide, indium zinc oxide (IZO), indium oxide containing tungsten oxide and zinc oxide, and the like are given.

Besides, as a material used for the electrode 102, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like.

Note that in the case where a composite material which is described later is provided in contact with the electrode 102, a variety of conductive materials can be used for the electrode 102 regardless of their work functions. Specifically, besides a material which has a high work function, a material which has a low work function can also be used.

<Material for Cathode>

As a material of the upper electrode 110 serving as a cathode, a material having a low work function (specifically, a work function of lower than 4.0 eV) is preferably used; however, in the case where the composite material is provided between the upper electrode 110 and the light-emitting layer to be in contact with the upper electrode 110, various conductive materials can be used for the upper electrode 110 regardless of their work functions.

Note that at least one of the upper electrode 110 and the electrode 102, from which light is extracted, is formed using a conductive film that transmits visible light. For the conductive film that transmits visible light, for example, indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added can be given. Further, a metal thin film having a thickness enough to transmit light (preferably, approximately 5 nm to 30 nm) can also be used.

<Material for EL Layer>

Specific examples of materials for the layers included in the above EL layer are described below.

<Hole-injection Layer>

The hole-injection layer is a layer having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesulfonate) (PEDOT/PSS), or the like to form the hole-injection layer.

Note that a composite material may be used for the hole-injection layer. When a composite material is used, any of various conductive materials can be used for the electrode 102 without any consideration of the work function, as described above.

The composite material is a material which contains a substance having a high transport property and an acceptor substance. The hole-injection layer formed of the composite material is not limited to a structure in which a substance having a high hole-transport property and an acceptor substance are contained in the same film, and may have a structure in which a layer containing a substance having a high hole-transport property and a layer containing an acceptor substance are stacked.

Note that it is preferable that the acceptor substance be added to the composite material so that the mass ratio of the acceptor substance to a substance having high hole-transport properties is from 0.1:1 to 4.0:1.

As the acceptor substance that is used for the composite material, a transition metal oxide, particularly an oxide of a metal belonging to Group 4 to 8 of the periodic table is preferred. Specifically, molybdenum oxide is particularly preferable. Note that molybdenum oxide has a low hygroscopic property.

As the substance having a high hole-transport property used for the composite material, any of various compounds such as an aromatic amine compound, a carbazole derivative, aromatic hydrocarbon, and a high molecular compound (including an oligomer, a dendrimer, or a polymer) can be used. Specifically, a substance having a hole mobility of $10^{-6}$ $cm^2$/Vs or higher is preferably used. However, other substances than the above described materials may also be used as long as the substances have a higher hole-transport property than an electron-transport property.

<Hole-transport Layer>

The hole-transport layer is a layer which contains a substance with a high hole-transport property. The hole-transport layer is not limited to a single layer, but may be a stack of two or more layers each containing a substance having a high hole-transport property. The hole-transport layer contains any substance having a higher hole-transport property than an electron-transport property, and preferably contains a substance having a hole mobility of $10^{-6}$ $cm^2$/V·s or higher because the driving voltage of the light-emitting element can be reduced.

<Light-emitting Layer>

The light-emitting layer is a layer which contains a light-emitting substance. The light-emitting layer is not limited to a single layer, but may be a stack of two or more layers each containing a light-emitting substance. As the light-emitting substance, a fluorescent compound or a phosphorescent compound can be used. A phosphorescent compound is preferably used as the light-emitting substance because the emission efficiency of the light-emitting element can be increased.

Note that those light-emitting substances are preferably dispersed in a host material. A host material preferably has higher excitation energy than the light-emitting substance.

<Electron-transport Layer>

The electron-transport layer is a layer which contains a substance having a high electron-transport property. The electron-transport layer is not limited to a single layer, but may be a stacked-layer of two or more layers each containing a substance having a high electron-transport property. The electron-transport layer contains any substance having a higher electron-transport property than a hole-transport property, and preferably contains a substance having an electron mobility of $10^{-6}$ cm$^2$/V·s or higher because the driving voltage of the light-emitting element can be reduced.

<Electron-injection Layer>

The electron-injection layer is a layer which contains a high electron-injection substance. The electron-injection layer is not limited to a single layer, but may be a stack of two or more layers each containing a substance having a high electron-injection property. The electron-injection layer is preferably provided because the efficiency of electron injection from the upper electrode 110 can be increased and the driving voltage of the light-emitting element can be reduced.

As the substance having a high electron-injection property, the following can be given: an alkali metal and an alkaline earth metal such as lithium (Li), cesium (Cs), calcium (Ca) and a compound thereof, such as lithium fluoride (LiF), cesium fluoride (CsF), and calcium fluoride (CaF$_2$). Alternatively, a layer containing a substance having an electron-transport property and an alkali metal, an alkaline earth metal, magnesium (Mg), or a compound thereof (e.g., an Alq layer containing magnesium (Mg)) can be used.

<Material for Intermediate Layer>

Specific examples of materials for the layers included in the intermediate layer are described below.

<Material for Charge Generation Layer>

The charge generation layer is a layer containing a substance having a high hole-transport property and an acceptor substance and thus can be formed using the above-described composite material.

<Material for Electron-relay Layer>

The electron-relay layer 122 is a layer which can quickly receive electrons drawn out by the acceptor substance in the charge-generation layer. Therefore, the electron-relay layer 122 is a layer which contains a substance having a high electron-transport property, and the LUMO level thereof is positioned between the acceptor level of the acceptor substance in the charge generation layer and the LUMO level of the light-emitting layer. Specifically, the LUMO level of the electron-relay layer 122 is preferably about from −5.0 eV to −3.0 eV.

As the material used for the electron-relay layer 122, for example, a perylene derivative and a nitrogen-containing condensed aromatic compound can be given. Note that, because of their stability, nitrogen-containing condensed aromatic compounds are preferable for the electron-relay layer 122. Among nitrogen-containing condensed aromatic compounds, a compound having an electron-withdrawing group such as a cyano group or fluorine is preferably used because such a compound further facilitates acceptance of electrons in the electron-relay layer 122.

<Material for Electron-injection Buffer Layer>

The electron-injection buffer layer 121 is a layer which facilitates electron injection from the charge generation layer into the light-emitting layer. By providing the electron-injection buffer layer 121 between the charge generation layer and the light-emitting layer, the injection barrier therebetween can be reduced.

A substance having a high electron-injection property can be used for the electron-injection buffer layer 121. For example, an alkali metal, an alkaline earth metal, a rare earth metal, a compound thereof (e.g., an alkali metal compound (including an oxide such as lithium oxide, a halide, and carbonate such as lithium carbonate or cesium carbonate), an alkaline earth metal compound (including an oxide, a halide, and carbonate), or a rare earth metal compound (including an oxide, a halide, and carbonate)) can be used.

Further, in the case where the electron-injection buffer layer 121 contains a substance having a high electron-transport property and a donor substance, the donor substance is preferably added so that the mass ratio of the donor substance to the substance having a high electron-transport property is from 0.001:1 to 0.1:1. Note that examples of the donor substance include an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate). Note that as the high electron-transport substance, a material similar to the above-described material for the electron-transport layer that can be formed in part of the EL layer can be used.

For example, in the first light-emitting element 201a included in the light-emitting device 211 of FIG. 5B, when a voltage which is higher than the threshold voltage of the first light-emitting element 201a is applied between the first lower electrode 102a and the upper electrode 110, holes are injected to the light-emitting layer from the first lower electrode 102a through the hole-injection layer 104 and the hole-transport layer 105, and electrons are injected to the light-emitting layer from the upper electrode 110 through the electron-injection layer 108 and the electron-transport layer 107. The injected holes and electrons are recombined in the light-emitting layer, so that the light-emitting organic compound contained in the light-emitting layer 106a of the first light-emitting element 201a emits light.

Note that a structure in which the hole-transport layer 105 is not provided and the hole-injection layer 104 also serves as the hole-transport layer 105 may be employed. Alternatively, a structure in which the electron-transport layer 107 is not provided and the electron-injection layer 108 also serves as the electron-transport layer 107 may be employed.

In the case of the light-emitting device having a tandem structure, such as the light-emitting devices 213 and 214 in FIGS. 6B and 6C, the intermediate layer 142 is provided between the EL layer 152 and the EL layer 153 in the first light-emitting element 201a.

Note that the number of the EL layers provided between the anode and the cathode is not limited to two. In the case of a structure in which n (n is a natural number of 2 or more) EL layers are provided between the anode and the cathode, an intermediate layer is provided between an m-th (in is a natural number greater than or equal to 1 and less than or equal to n−1) EL layer and an (m+1)-th EL layer.

Figure 7A:
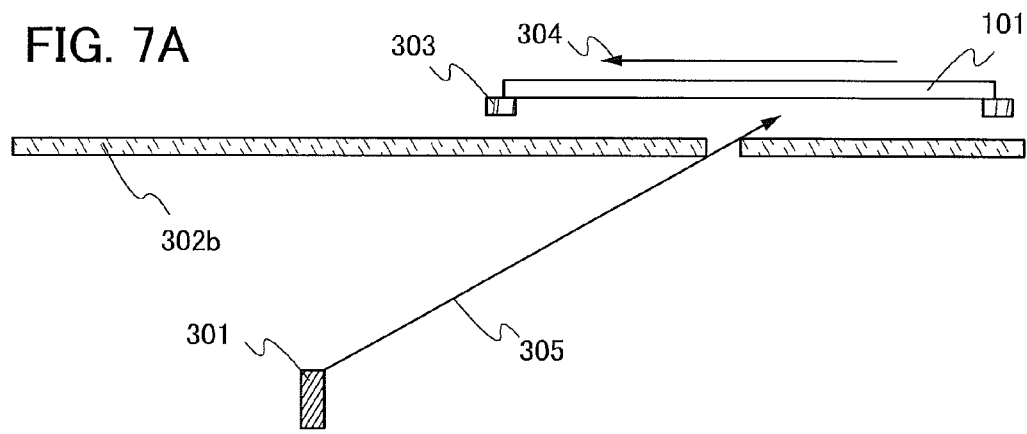
FIG. 7A is a cross-sectional view illustrating an example of a method for manufacturing a light-emitting device of one embodiment of the present invention.

Next, a method for forming a layer with high conductivity over the substrate 101 in which pixels are arranged in a stripe structure is described with reference to FIGS. 7A to 7C.

Figure 7B:
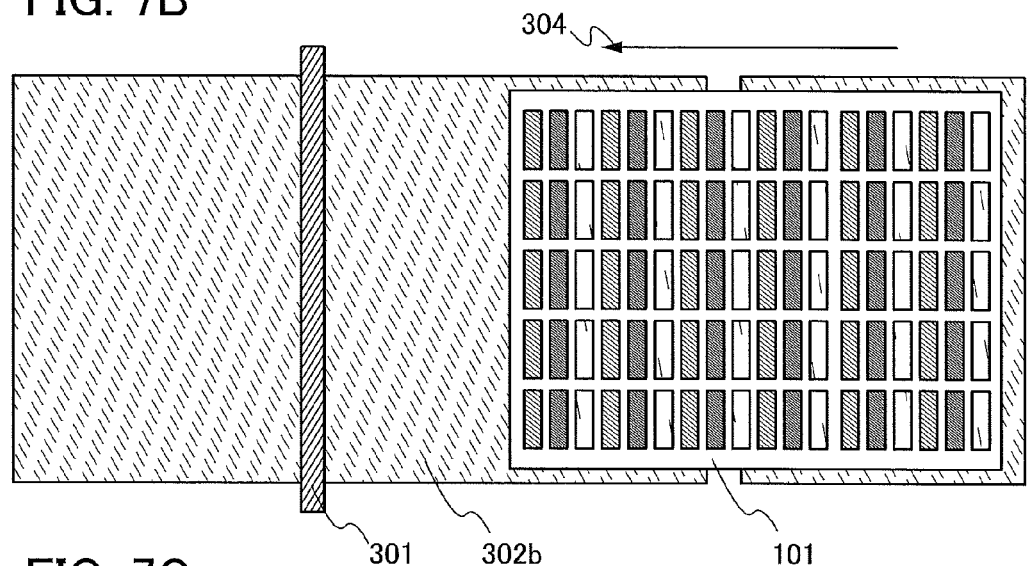
FIG. 7B is a plan view of the light-emitting device of FIG. 7A.
Figure 7C:
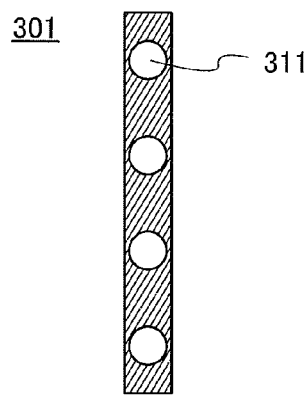
FIG. 7C is a plan view of an evaporation source 301 illustrated in FIG. 7A.
Figure 8:
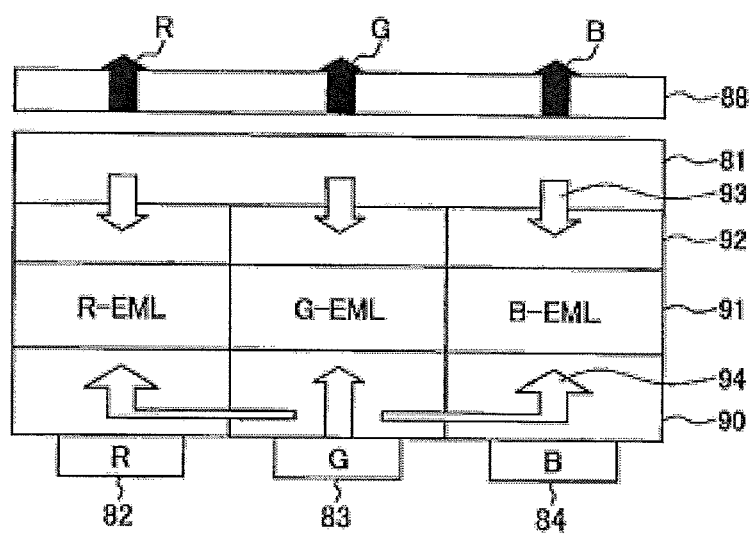
FIG. 8 is a schematic view for showing a situation where a crosstalk phenomenon occurs in single elements owing to current leakage through a carrier-injection layer and/or a carrier-transport layer with high conductivity, so that adjacent pixels emit light.
Figure 9:
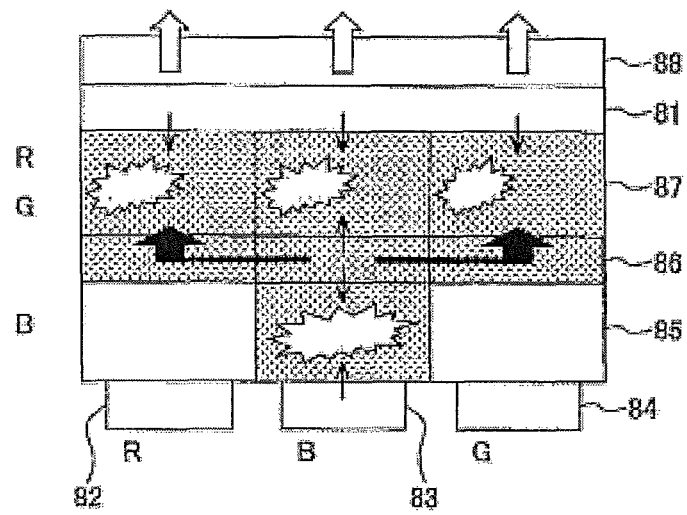
FIG. 9 is a schematic diagram for showing a situation where a crosstalk phenomenon is caused by an intermediate layer with high conductivity.
Figure 10:
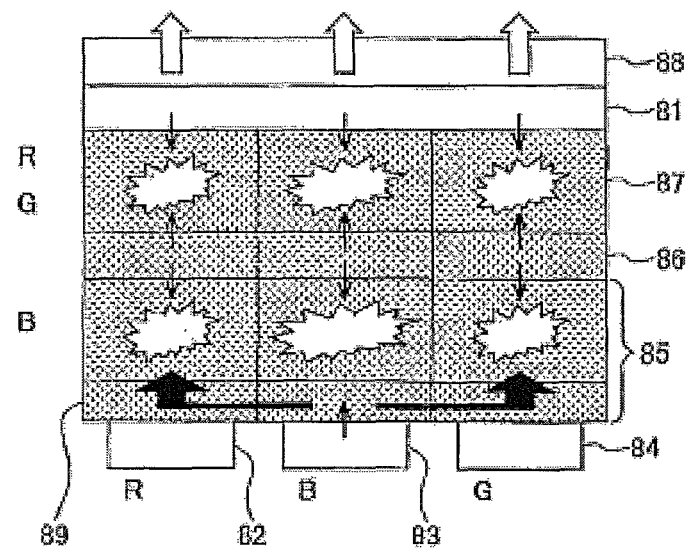
FIG. 10 is a schematic diagram for showing a situation where a crosstalk phenomenon is caused by a carrier-injection layer and/or a carrier-transport layer with high conductivity.
Figure 11:
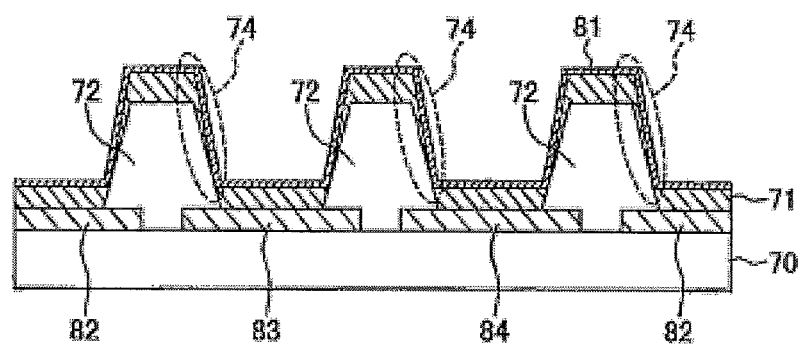
FIG. 11 is a cross-sectional view schematically illustrating a light-emitting device of a conventional technique 1.
Figure 12:
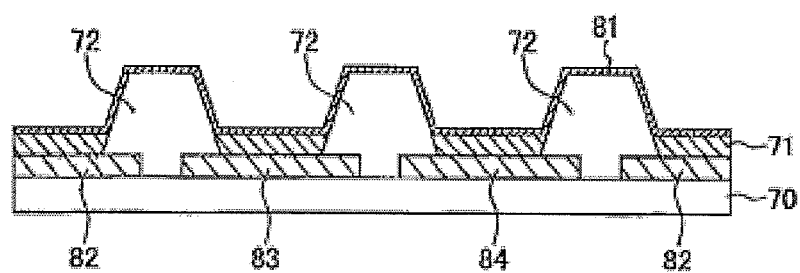
FIG. 12 is a cross-sectional view schematically illustrating a light-emitting device of a conventional technique 2.

The substrate 101 having a stripe structure as illustrated in FIG. 7B, in which a plurality of first-color pixels is arranged in the form of a line, a plurality of second-color pixels is arranged in the form of a line, and a plurality of third-color pixels is arranged in the form of a line, is prepared.

Next, deposition is performed under conditions as illustrated in FIG. 7A, in which the mask 302b having a slit is provided between the substrate 101 and the evaporation source 301 and a mask 303 is provided between the mask 302b and the substrate 101 in the state where the evaporation source 301 is positioned perpendicularly to the substrate 101. Note that the evaporation source 301 may be the one in which a plurality of point sources 311 is arranged in the form of a line as illustrated in FIG. 7C.

That is, as illustrated in FIG. 7A, the mask 302b having a slit is provided between the evaporation source 301 and the substrate 101 and an evaporation substance which is generated from the evaporation source 301 is blocked by the mask 302b, whereby an evaporation substance which passes through the slit flies in an oblique direction (the arrow 305) to the surface of the substrate 101. Further, the substrate 101 moves in a horizontal direction (the arrow 304) over the slit, whereby only the evaporation substance which flies in a direction with a certain angle can be attached to the substrate. Accordingly, the thickness of the deposited layer with high conductivity over one slope of the partition can be small.

This application is based on Japanese Patent Application serial no. 2012-280107 filed with Japan Patent Office on Dec. 21, 2012, the entire contents of which are hereby incorporated by reference.

What is claimed is:

1. A light-emitting device comprising:
a first lower electrode and a second lower electrode;
a partition between the first lower electrode and the second lower electrode;
an upper electrode over the first lower electrode, the partition, and the second lower electrode; and
a conductive layer and a light-emitting layer between the upper electrode and the first lower electrode, the partition, and the second lower electrode,
wherein conductivity of the conductive layer is higher than conductivity of the light-emitting layer and is lower than conductivity of each of the first lower electrode, the second lower electrode, and the upper electrode,
wherein the partition includes a first slope located on a first lower electrode side and a second slope located on a second lower electrode side, and
wherein a total thickness of the conductive layer and the light-emitting layer located over the first slope in a direction perpendicular to the first slope is larger than a total thickness of the conductive layer and the light-emitting layer located over the second slope in a direction perpendicular to the second slope.

2. The light-emitting device according to claim 1,
wherein the total thickness of the conductive layer and the light-emitting layer located over the second slope in the direction perpendicular to the second slope is smaller than a total thickness of the conductive layer and the light-emitting layer located over the first lower electrode in a direction perpendicular to the first lower electrode, and
wherein the total thickness of the conductive layer and the light-emitting layer located over the first slope in the direction perpendicular to the first slope is larger than the total thickness of the conductive layer and the light-emitting layer located over the first lower electrode in the direction perpendicular to the first lower electrode.

3. The light-emitting device according to claim 1,
wherein a thickness of the conductive layer located over the second slope in the direction perpendicular to the second slope is less than or equal to ½ of a thickness of the conductive layer located over the first slope in the direction perpendicular to the first slope.

4. The light-emitting device according to claim 1,
wherein a thickness of the conductive layer located over the second slope in the direction perpendicular to the second slope is less than or equal to ½ of a thickness of the conductive layer located over the first lower electrode in the direction perpendicular to the first lower electrode.

5. A light-emitting device comprising:
a first lower electrode and a second lower electrode;
a partition between the first lower electrode and the second lower electrode;
a first light-emitting layer over each of the first lower electrode, the partition, and the second lower electrode;
a first conductive layer over the first light-emitting layer;
a second light-emitting layer over the first conductive layer; and
an upper electrode over the second light-emitting layer,
wherein conductivity of the first conductive layer is higher than conductivity of each of the first light-emitting layer and the second light-emitting layer and is lower than conductivity of each of the first lower electrode, the second lower electrode, and the upper electrode,
wherein the partition includes a first slope located on a first lower electrode side and a second slope located on a second lower electrode side, and
wherein a thickness of the first conductive layer located over the first slope in a direction perpendicular to the first slope is larger than a thickness of the first conductive layer located over the second slope in a direction perpendicular to the second slope.

6. The light-emitting device according to claim 5,
wherein a thickness of the first conductive layer located over the second slope in the direction perpendicular to the second slope is less than or equal to ½ of a thickness of the first conductive layer located over the first slope in the direction perpendicular to the first slope.

7. The light-emitting device according to claim 5,
wherein a thickness of the first conductive layer located over the second slope in the direction perpendicular to the second slope is less than or equal to ½ of a thickness of the first conductive layer located over the first lower electrode in the direction perpendicular to the first lower electrode.

8. The light-emitting device according to claim 5, further comprising a color filter over the upper electrode,
wherein the color filter includes a region having a first color which overlaps with the first lower electrode and a region having a second color which overlaps with the second lower electrode, and
wherein the first color is different from the second color.

9. The light-emitting device according to claim 5,
wherein a plurality of first light-emitting elements emitting light of a first color is arranged in a form of a line,
wherein a plurality of second light-emitting elements emitting light of a second color is arranged in a form of a line,
wherein each of the plurality of first light-emitting elements includes the first light-emitting layer and the second light-emitting layer located between the first lower electrode and the upper electrode,
wherein each of the plurality of second light-emitting elements includes the first light-emitting layer and the second light-emitting layer located between the second lower electrode and the upper electrode, and wherein the partition is provided between each of the plurality of first light-emitting elements and each of the plurality of second light-emitting elements.

10. A light-emitting device according to claim 5, further comprising:

a second conductive layer over each of the first lower electrode, the partition, and the second lower electrode, and below the first light-emitting layer.

11. The light-emitting device according to claim 10, wherein a thickness of the second conductive layer located over the first slope in a direction perpendicular to the first slope is larger than a thickness of the second conductive layer located over the second slope in a direction perpendicular to the second slope.

12. The light-emitting device according to claim 10, wherein a thickness of the second conductive layer located over the second slope in the direction perpendicular to the second slope is less than or equal to ½ of a thickness of the second conductive layer located over the first slope in the direction perpendicular to the first slope.

13. The light-emitting device according to claim 10, wherein a thickness of the second conductive layer located over the second slope in the direction perpendicular to the second slope is less than or equal to ½ of a thickness of the second conductive layer located over the first lower electrode in the direction perpendicular to the first lower electrode.

* * * * *